United States Patent [19]

Nakajima et al.

[11] Patent Number: 5,029,118

[45] Date of Patent: Jul. 2, 1991

[54] PERIODIC NOISE CANCELING SYSTEM AND METHOD

[75] Inventors: Yuji Nakajima, Yokohama; Toru Kita, Yokosuka, both of Japan

[73] Assignee: Nissan Motor Co. Ltd., Yokohama, Japan

[21] Appl. No.: 420,696

[22] Filed: Oct. 11, 1989

Related U.S. Application Data

[63] Continuation of Ser. No. 937,637, Dec. 3, 1986, abandoned.

[30] Foreign Application Priority Data

| Dec. 4, 1985 | [JP] | Japan | 60-271668 |
| Dec. 4, 1985 | [JP] | Japan | 60-271669 |
| Dec. 4, 1985 | [JP] | Japan | 60-271670 |

[51] Int. Cl.$^5$ .............................................. G06F 15/31
[52] U.S. Cl. ........................... 364/572; 364/724.19; 364/574
[58] Field of Search ............ 364/575, 574, 554, 424.1, 364/574, 724.19; 375/99; 328/165; 73/660, 655, 862.36, 862.33, 862.27, 862.08

[56] References Cited

U.S. PATENT DOCUMENTS

| 3,889,108 | 6/1975 | Cantrell | 328/165 |
| 4,102,222 | 7/1978 | Miller et al. | 74/866 |
| 4,106,368 | 8/1978 | Ivey | 74/866 |
| 4,134,303 | 1/1979 | Davis | 73/660 |
| 4,270,223 | 5/1981 | Marston | 328/165 |
| 4,587,620 | 5/1986 | Niimi et al. | 364/574 |
| 4,608,650 | 8/1986 | Kapadia | 364/508 |
| 4,716,773 | 1/1988 | Nonomura et al. | 73/862.36 |

FOREIGN PATENT DOCUMENTS

| 50-11747 | 9/1975 | Japan . | |
| 0669231 | 1/1979 | U.S.S.R. | 73/862.36 |

OTHER PUBLICATIONS

Kobatake, "A Synchronous Adaptive Noise Cancelling System for Periodic Interference", *Transactions of the Society of Instrument and Control Engineers*, vol. 19, No. 3, pp. 34–40, 1983.

Widrow et al, "Adaptive Noise Cancelling: Principles and Application", *Proceedings of the IEEE*, vol. 63, No. 12, pp. 1692–1716, Dec. 1975.

Glover, Jr., "Adaptive Noise Canceling Applied to Sinusoidal Interference", Dec. 1977, IEEE Vol. AS-SP-25, No. 6, pp. 484–491.

*Primary Examiner*—Parshotam S. Lall
*Assistant Examiner*—S. A. Melnick
*Attorney, Agent, or Firm*—Pennie & Edmonds

[57] ABSTRACT

A system and method for canceling a periodic noise superposed on a real signal component of an original signal. The system comprises: a synchronous adaptive noise canceling filter which sequentially produces and corrects a noise component at each predetermined phase of the original signal in synchronization with a signal having a corelationship to a period of the original signal; a subtractor which subtracts the noise signal component produced by the synchronous adaptive noise canceling filter from the original signal so as to produce the real signal component as a target signal; and a signal generator which produces and sends a signal to the synchronous adaptive noise canceling filter so that the synchronous adaptive noise canceling filter produces a real periodic noise signal component without the real signal component on the basis of the signal component derived previously from the subtractor and original signal.

22 Claims, 16 Drawing Sheets

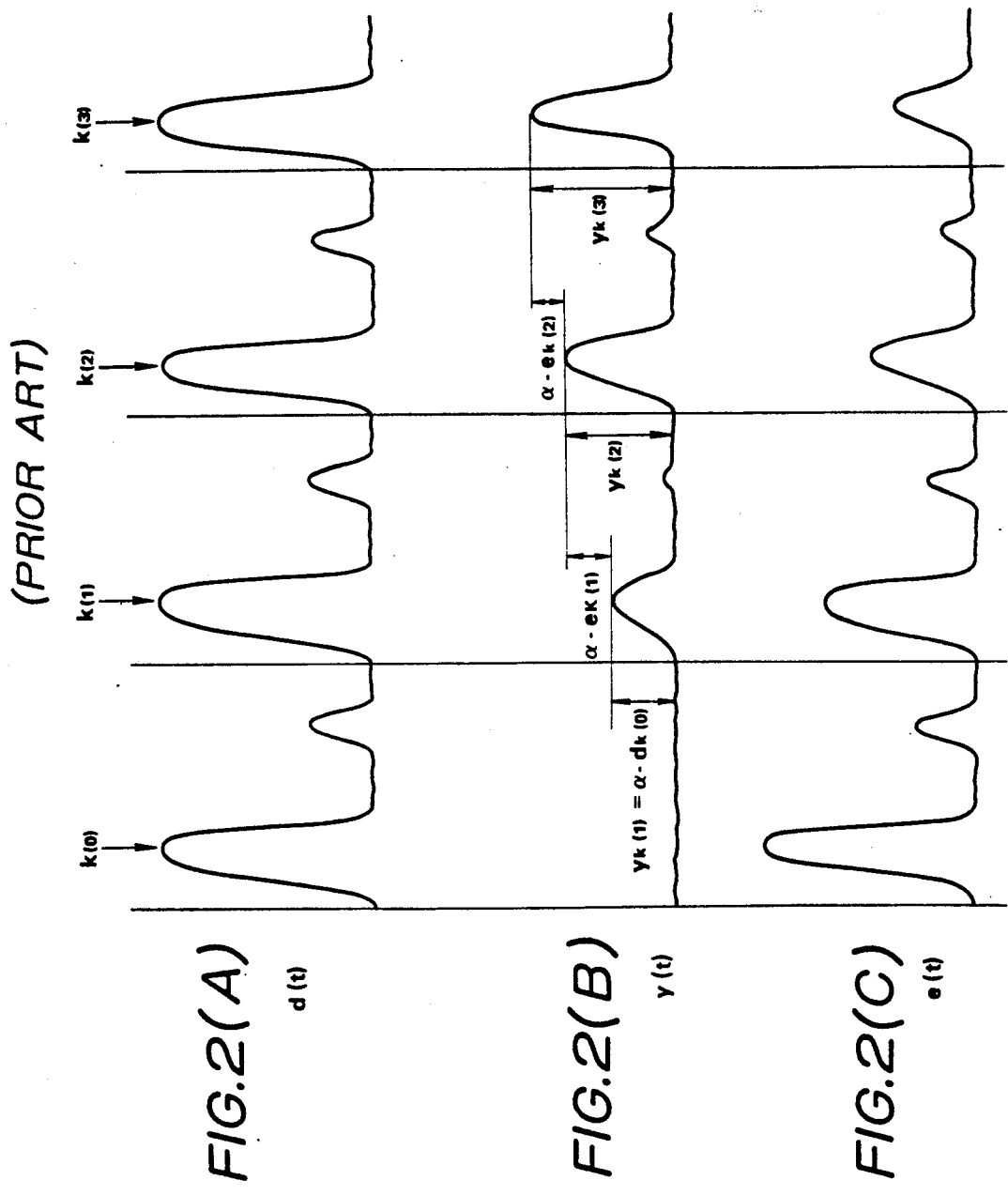

ONE REVOLUTION

PERIODIC NOISE CANCELING SYSTEM AND METHOD

This is a continuation of application Ser. No. 06/937,637, filed Dec. 3, 1986, now abandoned.

BACKGROUND OF THE INVENTION

1. Field of the Invention

The present invention relates to a system and method for canceling a periodic noise from an original input signal to be processed including such periodic noise components.

2. Description of the Prior Art

A conventional system for canceling a periodic noise from a primary signal including a periodic noise using a known synchronous adaptive noise canceling means is exemplified by a Japanese paper named "Papers of Society of Instrument and Control Engineers" volume 19, No. 3, pages 34 to 40, published on Mar. 20, 1983, and titled to "A synchronous Adaptive Noise canceling System for Periodic Interferences" by Hidefumi Kobatake.

FIG. 1 diagrammatically shows the synchronous adaptive noise canceling system disclosed in the above-identified Japanese document.

In FIG. 1, synchronous adaptive noise canceling means 1 produces sequentially a periodic noise component y(t) at each phase of the periodic noise in synchronization with a reference pulse signal X(t) having a correlation to the periodic noise included in an original signal d(t) to be processed in terms of its period. Then, the noise component y(t) is subtracted from the original signal d(t) to be processed to produce a target signal component e(t) included in the original signal d(t).

A specific operation of the above-described noise canceling system will be described below.

Assume d(t) shown in FIG. 2(A) as the original signal to be processed (it is noted that a real signal component included in the original signal d(t) to be processed has a "0" level (substantially zero voltage) for explanation conveniences).

The synchronous adaptive noise canceling means 1 produces the noise component yk(i) having a phase k at the present period in accordance with such an equation as shown below from a noise component yk(i−1) produced at a previous period and the target signal component ek(i−1) fedback and produced at the previous period.

$$yk(i) = yk(i-1) + a \cdot ek(i-1)$$

wherein $a$: correction coefficient and $0 < a < 1$ and · denotes a multiplication.

The target signal ek(i) is consequently derived in accordance with the following equation.

$$ek(i) = dk(i) - yk(i)$$

That is to say, assume that yk(0)=0.

As appreciated from FIG. 2(B), the following equation is established.

$ek(0) = dk(0)$ (a state in which no periodic noise is eliminated)

Thereafter, the synchronous adaptive noise canceling means 1 sequentially corrects the noise component and accordingly corrects the target signal as expressed in the following equations.

$$yk(1) = yk(0) + a \cdot ek(0)$$

$$ek(1) = dk(1) - yk(1)$$

$$yk(2) = yk(1) + a \cdot ek(1)$$

$$ek(2) = dk(2) - yk(2)$$

$$yk(3) = yk(2) + a \cdot ek(2)$$

$$ek(3) = dk(3) - yk(3)$$

If the synchronous adaptive noise canceling means 1 carries out the similar processing for the noise component at each of the other phases of the periodic noise, the noise component y(t) produced by the synchronous adaptive noise canceling means 1 finally converges the real signal component included in the target signal e(t) (in the case shown in FIGS. 2(A) through 2(C), the real signal component is "0"). It should be noted that the above-identified reference pulse signal X(t) is used to define each phase of the periodic noise. In addition, with stability and responsiveness of the synchronous adaptive noise canceling means 1 in the process of sequentially producing the noise components taken into account, the above-described correction coefficient $a$ is appropriately set in a range between zero and one, i.e., $0 < a < 1$.

On the other hand, for example, in an automatic transmission of an automotive vehicle, means for detecting a torque of an output shaft of the transmission and other means for controlling a torque converter in the transmission on the basis of the detected information of the torque by the above-described means have been developed in order to reduce torque variations on the output shaft of the transmission when a gear rotation ratio is switched in the transmission. The above-described torque detecting means and torque converter controlling means are exemplified by a Japanese Patent Application Unexamined Open No. Sho 50-117479 published on Sept. 13, 1975.

FIG. 3 diagrammatically shows a construction of the automatic transmission and above-described two means.

As shown in FIG. 3, the automatic transmission 10 includes the torque converter 11 through which an engine power is transmitted to an input shaft 12 with the engine torque multiplied. A driving force applied to the input shaft 12 is transmitted to an output shaft 14 with a rotation ratio and rotational direction set in an auxiliary transmission 13. When the output shaft is driven, a propeller shaft 15 is rotated. A magnetostrictive torque sensor 16 for detecting a torque of the output shaft 14 in the automatic transmission 10 is disposed in the proximity of the output shaft 14 as shown in FIG. 3. The torque sensor 16 magnetizes alternatingly the output shaft 14 and detects a change in a magnetic field as the variation of the torque imposed on the output shaft 14.

An output primary signal derived from the magnetostrictive torque sensor 16 is, e.g., shown in FIG. 4(A).

As shown in FIG. 4(A), an alternating signal corresponding to the alternating magnetization has an amplitude changing according to the magnitude of the torque. Since the output shaft 14 has a slight eccentricity and a slight dimensional error due to a material applied to the shaft, the output primary signal is periodically varied in synchronization with the rotation of the output shaft 14.

A signal processing unit 20 eliminates high frequency components of the output signal derived from the torque sensor 16 shown in FIG. 4(A) by means of a low-pass filter after a full-wave rectification of the signal and produces an output signal having a waveform, e.g., as shown in FIG. 4(B). The signal processing unit 20 detects the torque applied to the output shaft 14 on the basis of the output original signal d(t) shown in FIG. 4(B).

A direct current component of the output signal d(t) corresponds to an actual torque on the output shaft 14.

Since the same waveform as shown in FIG. 4(B) is repeatedly formed in synchronization with the rotation of the output shaft 14, the above-described synchronous adaptive noise canceling means 1 may conceivably be applied to eliminate such periodic variations.

Specifically, e.g., as shown in FIG. 3, an electromagnetic induction type rotation sensor 18 is opposingly disposed in the proximity of a surface of teeth on a parking gear 17 utilizing the parking gear 17 having a predetermined number of teeth and installed on the output shaft 14. The reference pulse signal X(t) is thus produced on the basis of the output signal derived from the rotation sensor 18.

The synchronous adaptive noise canceling filter (means) incorporated in the signal processing unit 20 receives the original signal d(t) shown in FIG. 4(B) derived on the basis of the detection signal from the magnetorestrictive torque sensor 16 and reference pulse signal X(t) to produce the target signal.

In a case when a signal such that the direct current component shown in FIG. 4(B) is a real signal on which the periodic noise component is superposed is subjected to the noise cancelation, the above-described synchronous noise canceling (filter) means 1 cannot extract the real signal component from the original signal to be processed including the periodic noise component.

This is because the conventional synchronous adaptive noise canceling means uses the target signal e(t) derived in the process of the noise elimination as a signal contributing the production of a new noise component, the noise components are sequentially produced in accordance with such an equation as $yk(i)=yk(i-1)+\alpha \cdot ek(i-1)$, and even the direct current component is also eliminated.

Specifically, in the case where the original signal d(t) is as shown in FIG. 5 (substantially the same as the waveform shown in FIG. 4(B)), the noise component yk(i) produced at the predetermined phase k gradually approaches the signal dk(i) to be processed in accordance with the above-described following equation:

$$yk(i)=yk(i-1)+\alpha \cdot ek(i-1)$$

Accordingly, since $yk(i) \approx dk(i)$, the signal ek(i) derived from the equation: $ek(i)=dk(i)-yk(i)$ approaches "0" (zero) level.

Consequently, the real signal component cannot be obtained from the original signal to be processed.

SUMMARY OF THE INVENTION

With the above-described problem in mind, it is an object of the present invention to provide a system and method for canceling a periodic noise in which the synchronous adaptive noise filtering means is used and which does not eliminate the real direct-current signal component of an original signal of which periodic noise components are superposed on the real direct current component with the periodic noises canceled in as large numbers as possible.

It is another object of the present invention to provide the periodic noise canceling system and method which are highly accurate and applicable to a system for detecting a torque imposed on an output shaft of an automatic transmission.

The above-described objects can be achieved by providing a system for canceling a periodic noise superposed on a real signal component of an original signal, comprising: a) first means for sequentially producing a noise component at each predetermined phase of the original signal having the periodic noise and real signal component in synchronization with a signal having a correlationship to a period of the original signal; b) second means for subtracting the noise signal component produced by the first means from the original signal so as to produce the real signal component as a target signal; and c) third means for producing and sending a signal to the first means so that the first means produces a real periodic noise signal component without the real signal component on the basis of the real signal component derived previously from the second means and the original signal.

The above-described objects can be achieved by providing a system for detecting a torque imposed on an output shaft of an automatic transmission, comprising: a) a magnetostrictive sensor for detecting a change in a magnetic field of the output shaft which is alternatingly magnetized with the change in the torque imposed on the output shaft and outputting a first signal indicating the detected change in the magnetic field; b) first means for detecting a rotation of the output shaft and outputting a second signal in synchronization with the rotation of the output shaft; c) second means for sequentially producing a noise component at each predetermined phase of the first signal derived from the magnetostrictive sensor in synchronization with the second signal derived from the first means; d) third means for subtracting the noise signal component produced by the second means from the first signal so as to produce a real signal component of the first signal; and e) fourth means for producing and sending a third signal to the second means so that the second means produces a real noise signal component without the real signal component derived previously from the third means and the first signal derived from the magnetostrictive sensor.

The above-described obJects can also be achieved by providing a method for canceling a periodic noise superposed on a real signal component of an original signal, comprising the steps of: a) providing first means for producing sequentially a noise signal component at each predetermined phase of the original signal having the periodic noise and real signal component in synchronization with a reference signal having a correlationship to a period of the original signal; b) subtracting the noise signal component produced in the step a) from the original signal so as to produce the real signal component as a target signal; and c) producing and sending a signal to the first means so that the first means produces a real noise signal component without the real signal component derived previously in the step b) and the original signal.

BRIEF DESCRIPTION OF THE DRAWINGS

FIGS. 2(A), 2(B), and 2(C) are waveform charts of respective input and output signals in the conventional periodic noise canceling system shown in FIG. 1.

FIGS. 9(A) through 9(F) are signal waveform charts of respective input and output signals in the periodic noise canceling system functionally shown in FIG. 6.

DETAILED DESCRIPTION OF THE PREFERRED EMBODIMENTS

Reference will hereinafter be made to the drawings in order to facilitate understanding of the present invention. The conventional periodic noise canceling system has been described with reference to FIGS. 1 through 5. The magnetorestrictive torque detecting apparatus is exemplified by a United States patent application Ser. No. 735,591 filed on May 20, 1985. The contents of the above-identified U.S. Pat. Application is hereby incorporated by reference.

FIRST PREFERRED EMBODIMENT

Figure 6:
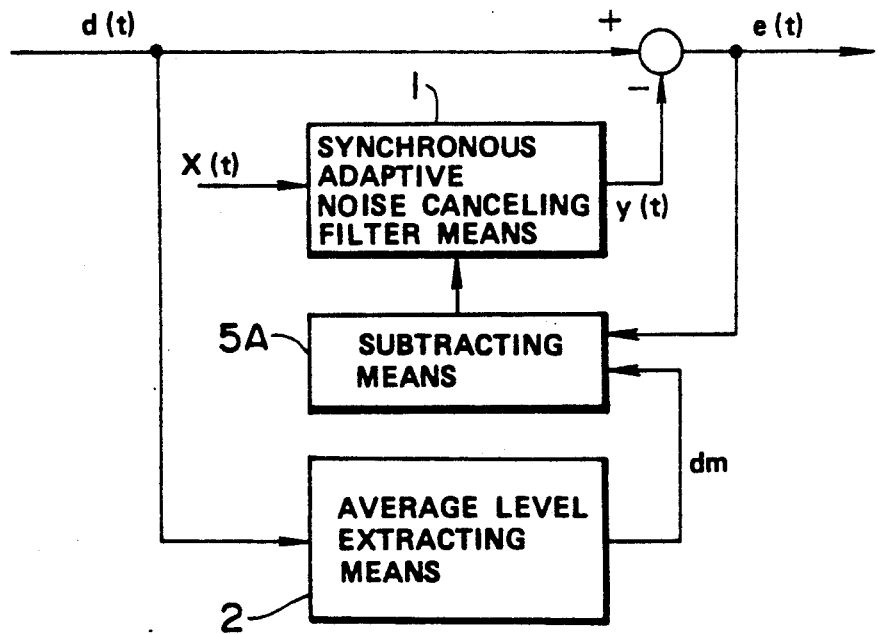
FIG. 6 is a functional block diagram of a periodic noise canceling system in a first preferred embodiment according to the present invention for conceptual explanation purposes of the first preferred embodiment.

FIG. 6 shows a functional block diagram of a first preferred embodiment for explaining a general concept of the first preferred embodiment.

Synchronous adaptive noise canceling filter means 1 sequentially corrects and produces a noise component y(t) at each phase of the periodic noise signal in synchronization with the reference pulse X(t) having a correlationship to the periodic noise in their periods of both reference pulse and the periodic noise of an original input signal d(t) to be processed including the periodic noise. The noise component y(t) produced from the synchronous adaptive noise canceling filter means 1 is substracted from the original signal d(t) to be processed to produce the target signal e(t).

The noise canceling system in the first preferred embodiment is based on the above-described signal processing method.

The concept of adaptive noise canceling is exemplified by a part of an English paper on PROCEEDINGS OF THE IEEE, VOL. 63, No. 12, published on December, 1975 entitled to "ADAPTIVE NOISE CANCELLING: Principles and Applications".

The noise canceling system in the first preferred embodiment further comprises: (a) average level extracting means 2 for sampling the original input signal d(t) and extracting an average level $d_m$ of the original input signal to be processed d(t); (b) subtracting means 5A for substracting the average level $d_m$ of the signal d(t) extracted by the average level subtracting means 2 from the level of the target signal e(t) produced at the same time as the synchronous adaptive noise canceling filter means 1 produces the above-described noise component y(t), an output signal of the subtracting means 5A being contributed to producing the noise component y(t) from the synchronous adaptive noise canceling filter means 1.

The average level extracting means 2 always extracts the average level $d_m$ of the original signal d(t) to be processed. In a predetermined phase k, the noise component yk(i) produced by the synchronous adaptive noise canceling filter means 1 is subtracted from the signal dk(i) to produce the target signal ek(i).

That is to say, $$ek(i) = dk(i) - yk(i)$$

If the above-described processing is sequentially carried out for the other phases, the noise components y(t) sequentially produced by the synchronous adaptive noise canceling means 1 are finally converged to the original signal d(t) to be processed from which the average level of the original signal d(t) is subtracted.

Figure 7:
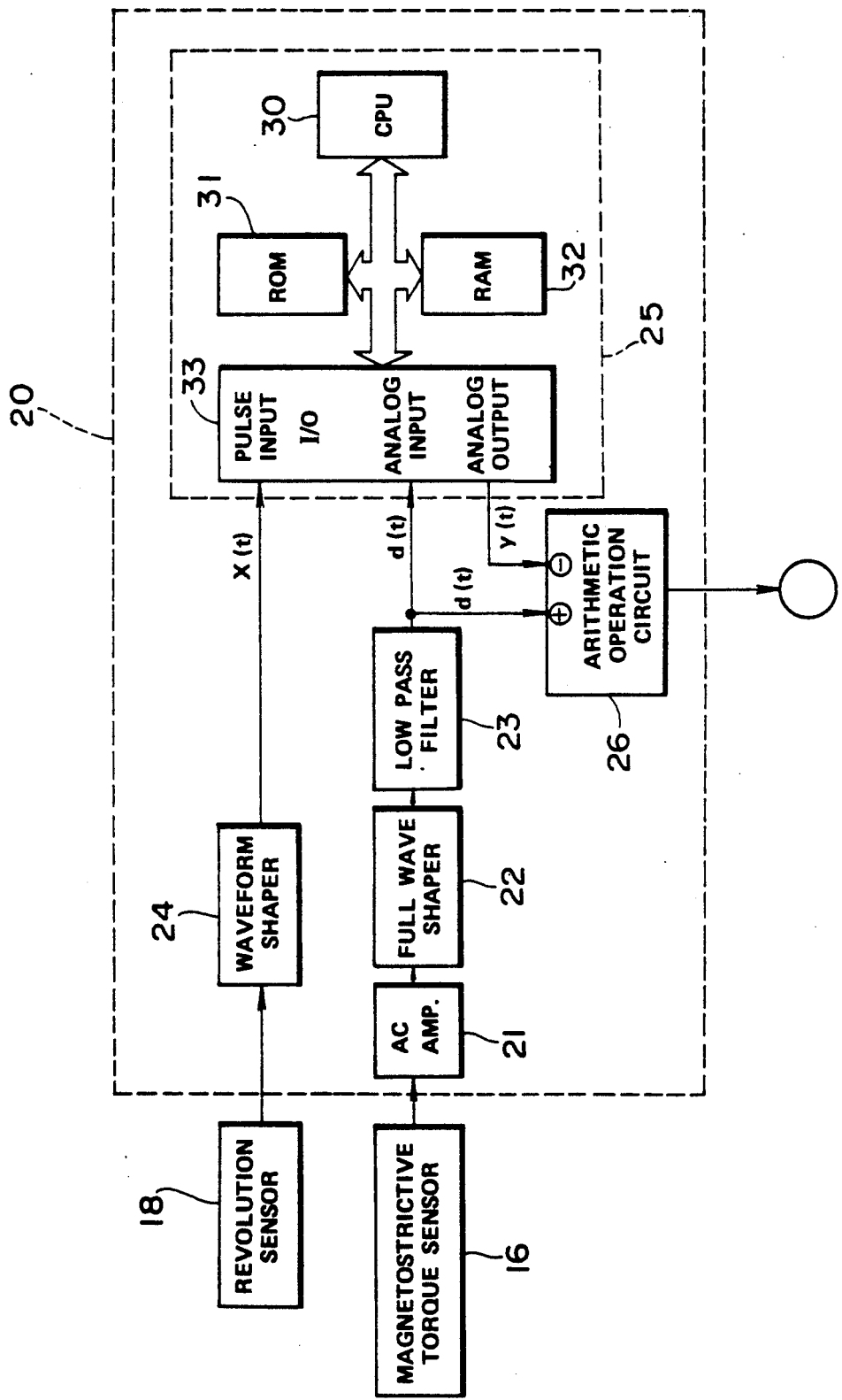
FIG. 7 is a circuit block diagram of the periodic noise canceling system shown in FIG. 6.

FIG. 7 shows a circuit block diagram of the periodic noise canceling system in the first preferred embodiment according to the present invention. In this embodiment, the periodic noise canceling system is applicable to the apparatus which detects the torque imposed on the output shaft 14 of the transmission 13 in the vehicle automatic transmission 10 shown in FIG. 3.

Figure 1:
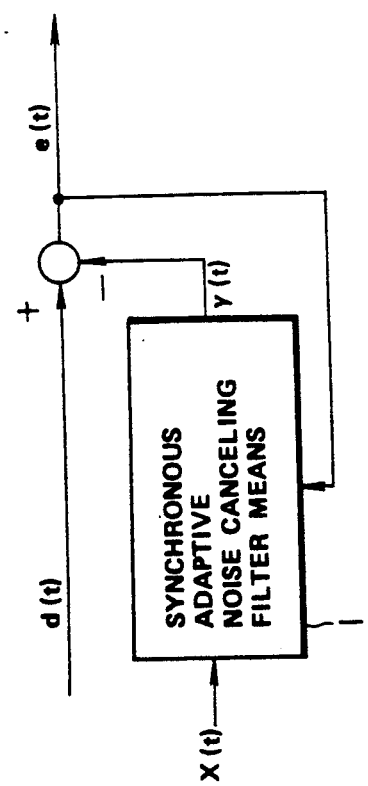
FIG. 1 is a functional block diagram of a conventional system for canceling periodic noise disclosed in the Japanese document.
Figure 3:
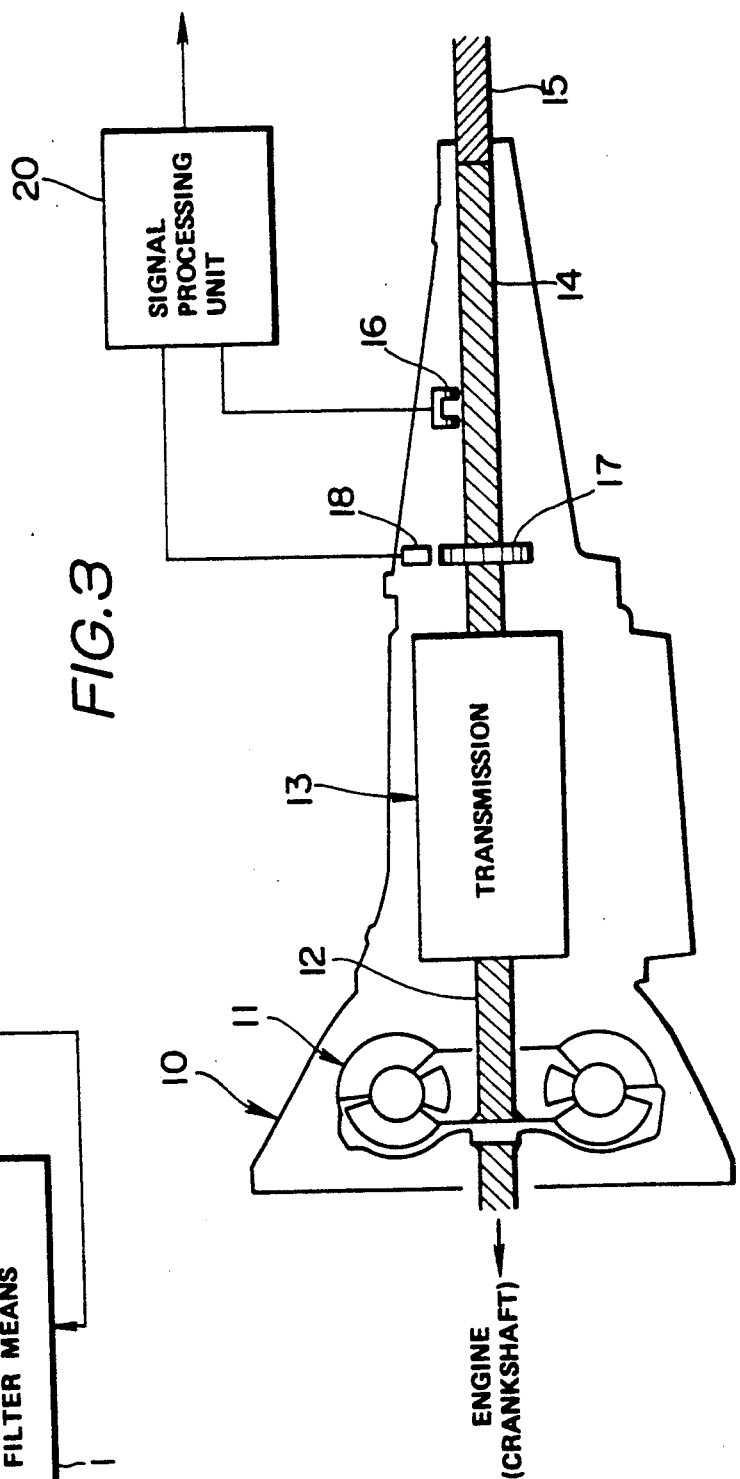
FIG. 3 is a schematic drawing of an example of apparatus for detecting a torque imposed on an output shaft of an automatic transmission in an automotive vehicle to which the periodic noise canceling system and method according to the present invention are applicable.

In FIG. 7, the magnetostrictive torque sensor 16 detects the torque imposed on the output shaft 14 of the transmission 13 in the Way as shown in FIG. 3. The rotation sensor 18 detects the rotation of the output shaft 14 shown in FIG. 3. These torque and rotation sensors 16 and 18 are installed in the way as shown in FIG. 3. The signal processing unit generally denoted by numeral 20 produces a signal directly contributing the detection of the output shaft torque on the basis of the respective detection signals derived from the magnetostrictive torque sensor 16 and rotation sensor 18.

Figure 4A:
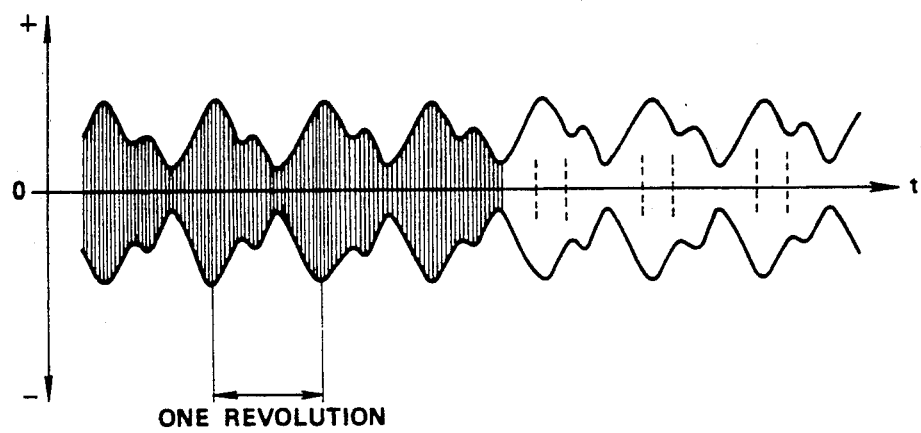
FIGS. 4(A) and 4(B) are waveform charts of respective signals derived from a magnetostrictive torque sensor used in the torque detecting apparatus shown in FIG. 3.
Figure 4B:
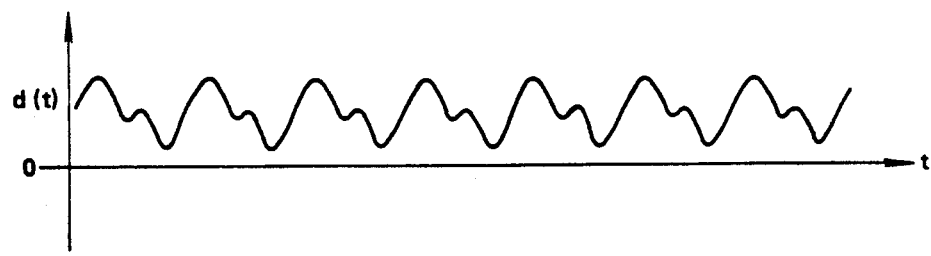
Figure 5:
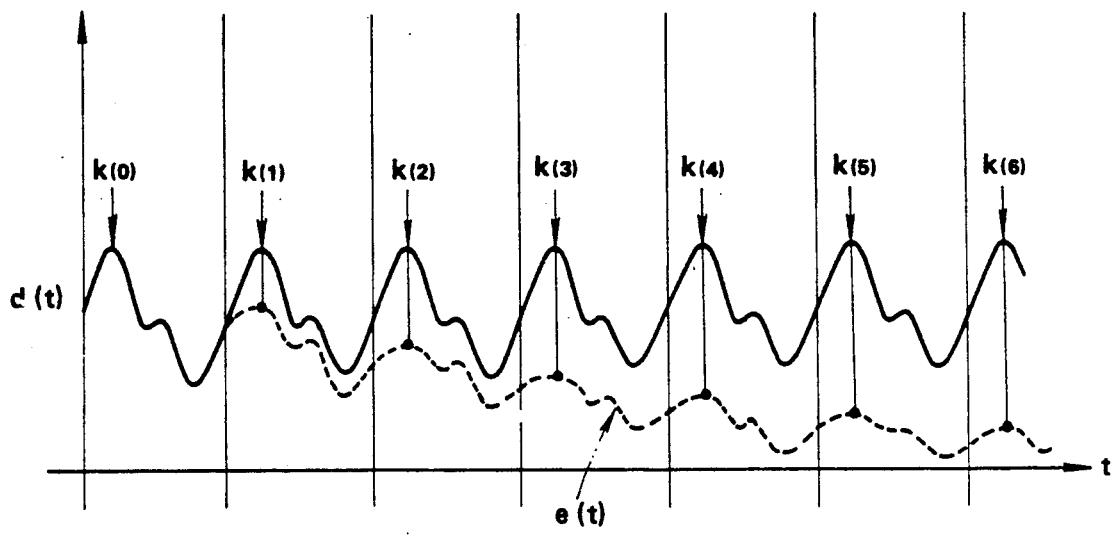
FIG. 5 is another waveform chart of input and output signals of the conventional periodic noise canceling system shown in FIG. 1.

The signal processing unit 20 in this embodiment comprises: (a) an alternating current (AC) amplification circuit (AMP.) 21 which amplifies the detection signal from the magnetostrictive torque sensor 16 (refer to FIG. 4(A)); (b) a full-wave rectification circuit 22 which full-wave rectifies the output signal from the alternating current amplification circuit (AC AMP.) 21; (c) a low pass filter 23 which eliminates the high frequency components in the signal derived from the full-wave rectification circuit 22; and (d) a waveform shaper 24 which receives the detection signal from the rotation sensor 18 and converts it into a rectangular pulse signal. The signal outputted from the above-described low-pass filter 23 takes a waveform as shown in FIG. 4(B). The rectangular pulse signal from the waveform shaper 24 is a rectangular output waveform having the same number N of pulses as that of teeth of the parking gear 17 whenever the output shaft 14 of the automatic transmission is rotated through one revolution. In addition, a main control circuit 25 is incorporated in the signal processing unit 20. The main control circuit 25 receives the signal derived from the low pass filter 23 as the original signal d(t) to be processed and receives the signal derived from the waveform shaper 24 as the reference pulse signal X(t). Specifically, the main control circuit 25 comprises: a CPU 30; ROM 31; and RAM 32. The CPU is an abbreviation for a Central Processing Unit, the ROM 31 is for a Read Only Memory, and the RAM 32 is for a Random Access Memory. An interface circuit 33 is constituted by an A/D converter, D/A converter, and so on. An arithmetic operation circuit 26 carries out a subtraction operation of subtracting the noise component y(t) derived from the main control circuit 25 from the signal d(t) derived from the low pass filter 23. The output signal from the arithmetic operation circuit 26 is the target signal e(t). It is noted that the average level extracting means 2 and subtracting means 5A shown in FIG. 6 are achieved in the main control circuit 25.

Next, an operation of the above-described periodic noise canceling system in the first preferred embodiment will be described with reference to FIG. 8.

Figure 8:
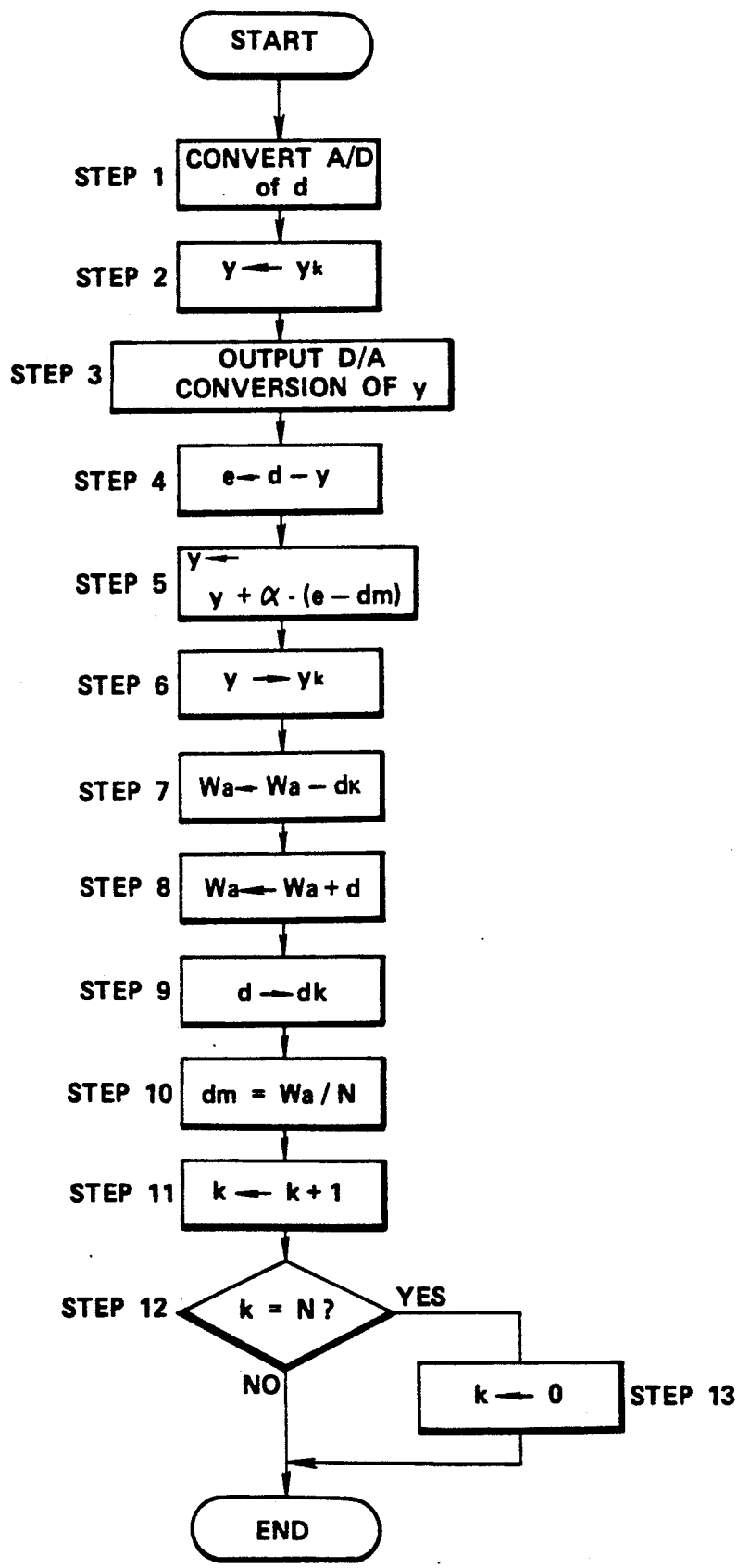
FIG. 8 is an operational flowchart in the first preferred embodiment on which a main control circuit 25 shown in FIG. 7 is executed.

FIG. 8 shows an operational flowchart of the main control circuit 25 in the first preferred embodiment shown in FIG. 7.

Figure 9:
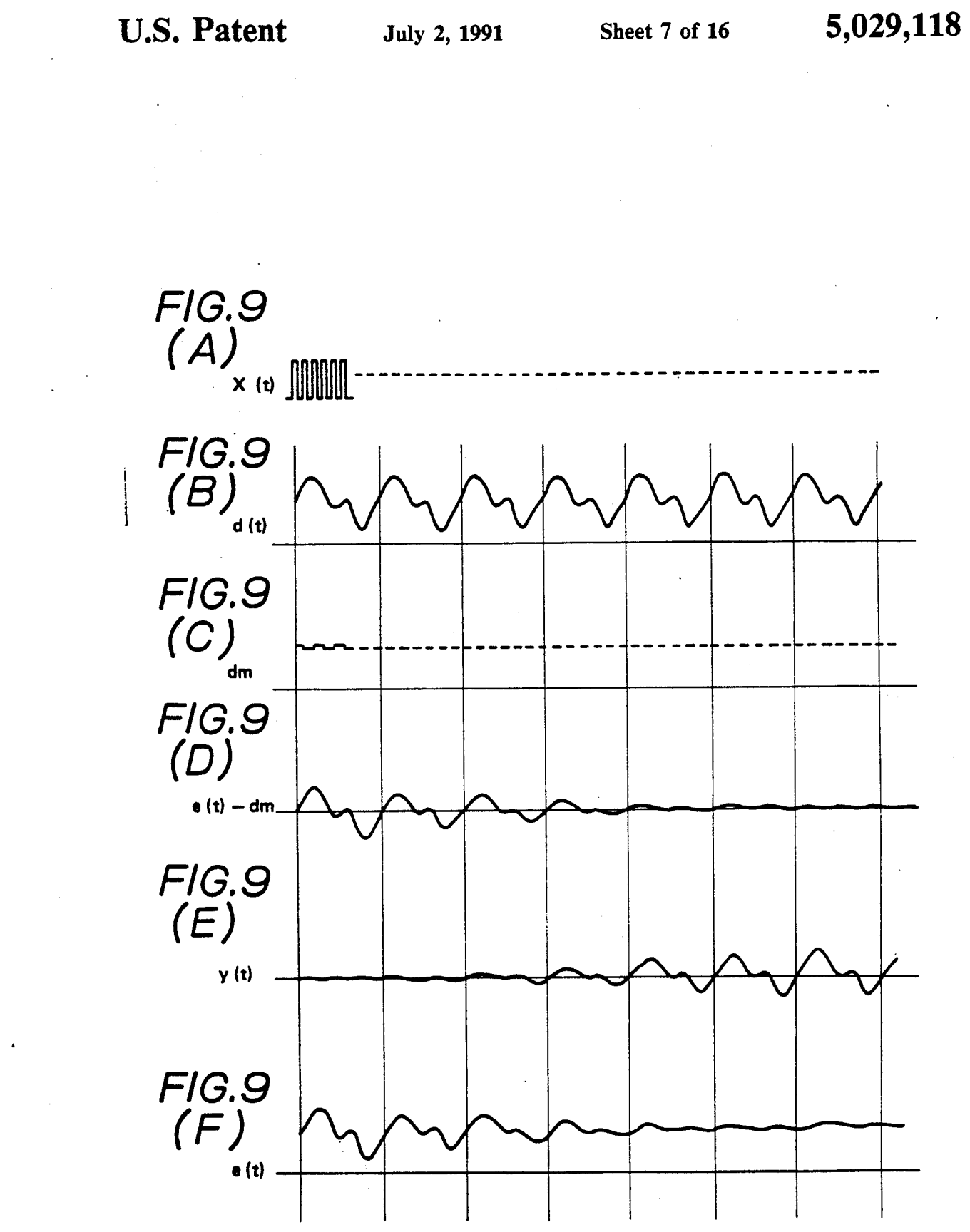

The pulse signal X(t) via the waveform shaper 24 and the signal d(t) via the low pass filter 23 are shown in FIGS. 9(A) and 9(B), respectively. The main control circuit 25 (CPU 30) receives the above-described pulse signal X(t) as an interrupt signal X(t). A series of processings shown in FIG. 8 is carried out whenever the pulse signal X(t) rises. It is noted that the pulse signal X(t) rises whenever the output shaft of the transmission is rotated through 1/N rotation. Each rotation position (phase) at which the signal X(t) rises corresponds to a subscript k of respective symbols shown in FIG. 8.

In a step 1, the CPU 30 reads the signal value d sampled when the interrupt by the incoming pulse signal X(t) occurs and converts the sampled value d into a digital value and registered into a common register d. The noise component yk calculated and stored in the RAM 32 when the previous rotational position (phase) at which the pulse signal X(t) rises is read out into the common register y in a step 2. The noise component y stored in the common register y is digital-to-analog converted (D/A conversion) in a step 3. When the noise component y is outputted from the main control circuit 25, the noise component y is subtracted from the signal d(t) derived at that time by means of the arithmetic operation circuit 26 so that the target signal e is outputted from the signal processing unit 20.

Furthermore, the main control unit 25 calculates a difference e between the original signal value d and noise component value y stored in the corresponding common register d and y in order to produce the same signal as the output (the target signal e) from the above-described arithmetic operation circuit 26, in a step 4. A new noise component is calculated in accordance with $y + a \cdot (e - d_m)$, wherein $0 < a < 1$, on the basis of the derived difference e, the noise component y stored in the common register y, the average level calculated as will be described later, in a step 5. The calculated value is newly stored in the common register y. The noise component yk stored within the RAM 32 is updated to the noise component stored in the register y in a step 6.

When the noise component yk of the RAM 32 is updated to the newly calculated noise component stored in the register y, in the step 6, the routine is transferred to an extraction processing of the average level $d_m$ to be used in the calculation of the above-described step 5.

The register Wa stores the sum of the signal values d corresponding to the past one rotation (one period) and sampled whenever the output shaft of the transmission is rotated through 1/N revolution (for each phase of 360/N degree). When the signal value d is sampled at the corresponding rotational position (phase), the signal value d sampled at the previous same rotational position (phase) is subtracted from the sum value within the register Wa in a step 7.

In a step 8, the signal value d newly sampled is added to the subtracted value in the step 7 and the added value is stored in the register Wa. Consequently, the register Wa always holds a state in which the sum of the signal values d sampled at the past one period (refer to FIG. 10). Thereafter, the signal value dk within the RAM 32 newly sampled is updated in a step 9. In a step 10, the sum stored in the above-described register Wa is divided by the number of samplings N of the one period to calculate the average level $d_m$. That is to say, the average value $d_m$ is an average value of the past one pedriod of the original signal d(t) to be processed.

Thereafter, the main control circuit 25 repeatedly carries out the processings of the sampling of the signal values d, output of the noise component y, new production of the noise component y, and extraction of the average level $d_m$ whenever the pulse signal X(t) rises. During the above-described processing, a register k is incremented indicating the rotational position (phase) whenever the above-described series of processings is ended in a step 11. Whenever the value of the register k indicates N, the register k is reset to "0" in a step 13.

As described above, the average level $d_m$ at the past one period of the signal d(t) to be processed is derived, the new noise component y is calculated in accordance with the formula $y + a \times (e - d_m)$ on the basis of the target signal value e from which the average level $d_m$ is subtracted and the noise component y previously calculated. Therefore, the noise component y(t) outputted from the main control circuit 25 approaches the real noise component as shown in FIG. 9(E). Accordingly, the output signal from the arithmetic operation circuit 26, i.e., the target signal e(t) is converged to the real signal included in the signal d(t) to be processed (the direct current level corresponding to the torque) (refer to FIG. 9(E)).

Consequently, the torque imposed on the output shaft of the transmission can be detected on the basis of the signal outputted from the signal processing unit 20 without substantial time delay and the control of the torque converter can accurately be carried out on the basis of the detected torque.

It is noted that the means for extracting the average level of the signal d(t) to be processed is not limited to the above-described preferred embodiment.

For example, a movement average method in which a new average level $d_m$ is derived in accordance with, e.g., $d_m \leftarrow (1-\beta)d_m + \beta \cdot d$, wherein $\beta: 0 < \beta < 1$. Such a low pass filter may be used as extracting the average level with the signal d(t) analogously processed. Since in the first preferred embodiment, the periodic noise synchronized with the rotating object (output shaft of the transmission) is cancelled, the reference pulse signal having an equal width of pulse can relatively easily be generated. However, the use of a PLL (Phase-Locked Loop) may be effective when the pulse signal having a high frequency is to be generated. The synchronous adaptive noise canceling filter means can be achieved by the microcomputer (main control circuit 25) as described in the first preferred embodiment and can alternatively be achieved by such a combination as the elements of the A/D converter, D/A converter, and shift register.

SECOND PREFERRED EMBODIMENT

Figure 11:
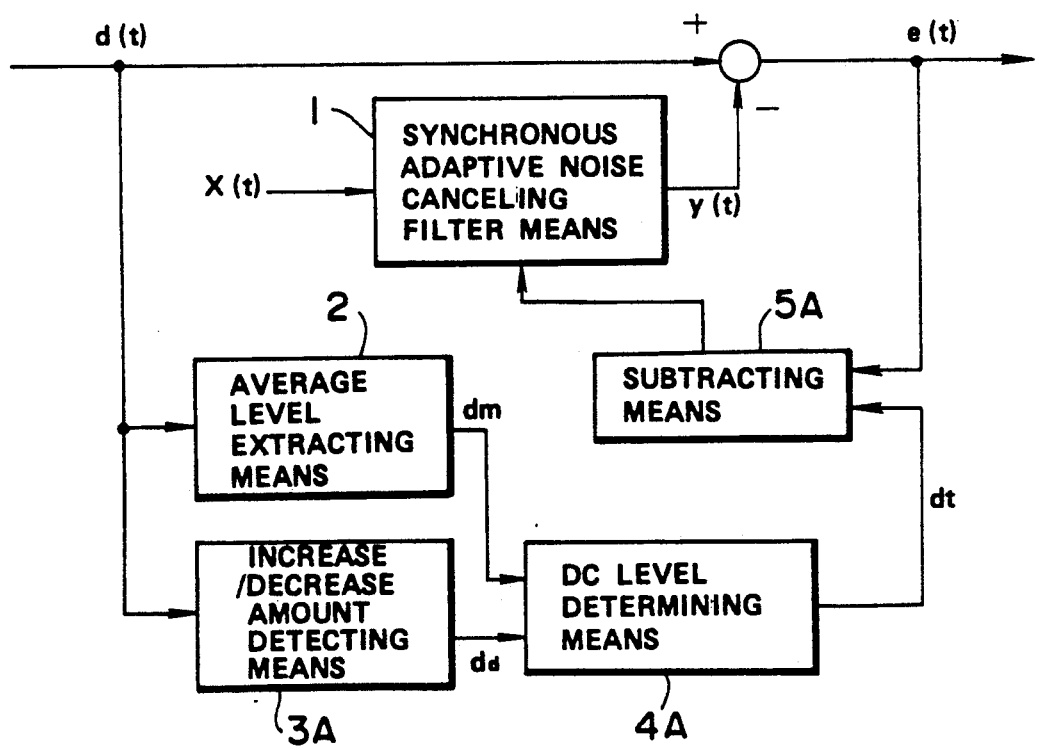
FIG. 11 is a functional block diagram of the periodic noise canceling system in a second preferred embodiment according to the present invention.

FIG. 11 shows a functional block diagram of the periodic noise canceling system in a second preferred embodiment according to the present invention for explaining a general concept of the periodic noise canceling system in the second preferred embodiment.

The synchronous adaptive noise canceling filter means 1 has been described. The periodic noise canceling system further comprises: (a) average level extracting means 2 for extracting the average level of the original signal d(t); (b) increase/decrease amount detecting means 3A for detecting an amount of increase or decrease (change rate) of the direct current level of the original signal d(t) on the basis of the received original signal d(t) to be processed; (c) direct current level determining means 4A for determining a direct current level $d_t$ of the original signal d(t) to be processed on the basis of the average level $d_m$ of the signal d(t) extracted by the average level extracting means 2 and the amount of increase or decrease (change rate) in the direct current level of the signal d(t) detected by the increase/decrease amount detecting means 3A; and (d) subtracting means 5A for subtracting the direct current level $d_d$ determined by the direct current level determining means 4A from the target signal e(t) currently derived when the synchronous adaptive noise canceling filter means 1 produces the noise component, the output signal from the subtracting means 5A being contributed to produce the noise component y(t) in the synchronous adaptive noise canceling filter means 1.

The average level extracting means 2 extracts the average level of the signal d(t) and the increase/decrease amount detecting means 3A detects the increase/decrease amount $d_d$ of the direct current level of the original signal d(t) to be processed. Then, the direct current level determining means 4A determines the direct current level $d_t$ of the signal d(t) to be processed on the basis of the average level $d_m$ extracted by the average level extracting means 2 and increase/decrease amount detecting means 3A. Then, if the direct current level of the signal d(t) is substantially constant as appreciated from FIG. 4(B), the average level $d_m$ to be extracted and actual direct current level are substantially equal to each other. Therefore, the average level $d_m$, e.g., from the average level extracting means 2 is determined directly to be the direct current level $d_t$ by means of the direct current level determining means 4 on the basis of the detected increase/decrease amount $d_d$ which becomes substantially "0" (zero level).

Figure 12:
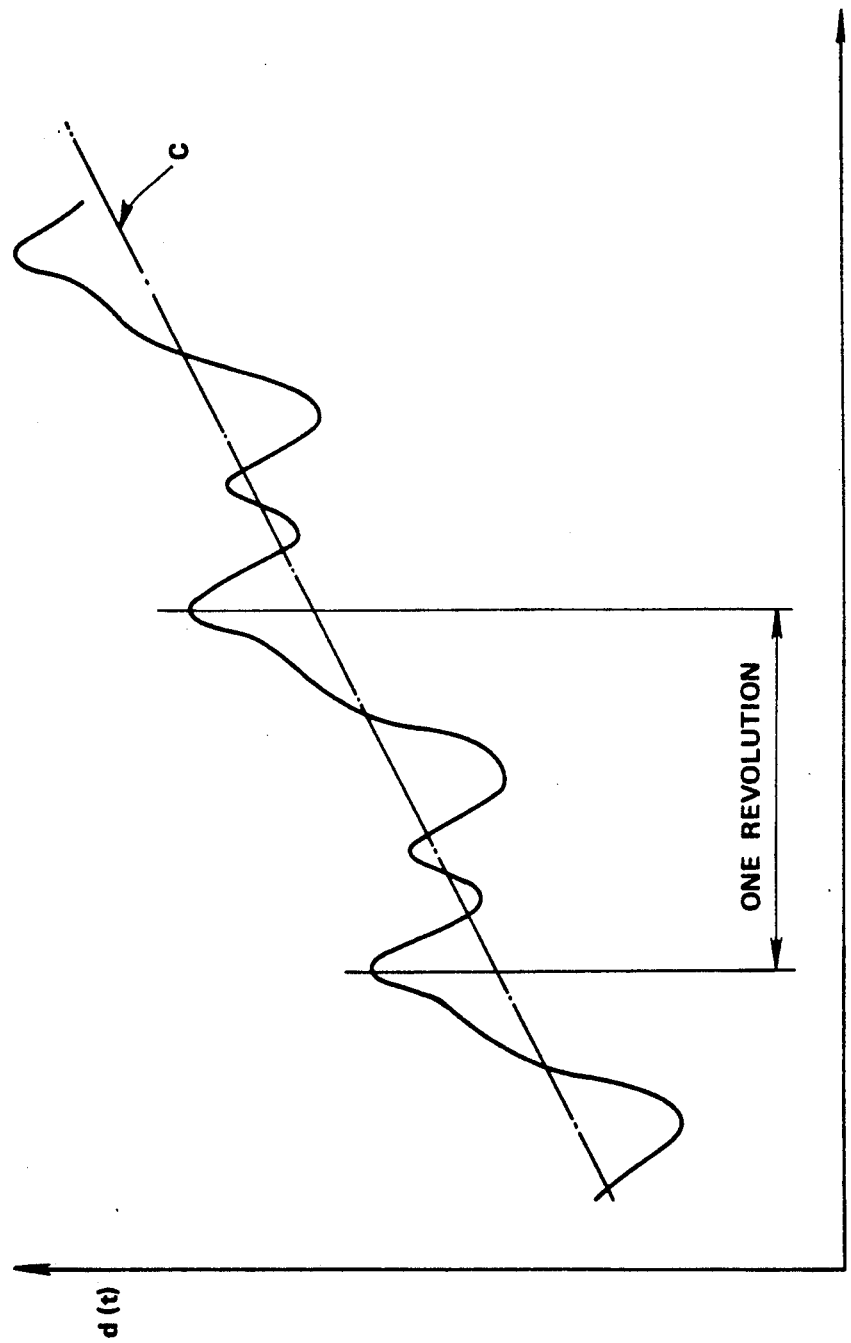
FIG. 12 is a waveform chart of another example of an original input signal d(t) to be processed.

In addition, if the direct current level of the signal d(t) to be processed gradually changes as shown in FIG. 12, the difference between the extracted average level $d_m$ and actual direct current level becomes large. This is because the above-described average level $d_m$ depends on a state of the signal d(t) to be processed before the average level $d_m$ is extracted. Therefore, the direct current level determining means 4 predicts the difference between the average level extracted at that time and actual direct current level, e.g., on the basis of the increase/decrease amount $d_d$ and determines the direct current level $d_t$ on the basis of the predicted value and the average level $d_m$.

As described above, the direct current level $d_t$ of the original signal d(t) to be processed is determined by the direct current level determining means 4. However, with the predetermined phase of the periodic noise included in the signal d(t) to be processed taken into consideration, the synchronous adaptive noise canceling means 1 inputs the output signal expressed as ek(i−1)−$d_t$ from the subtracting means 5A and on the basis of this signal produces a noise component yk(i) in accordance with $yk(i) = yk(i-1) + \alpha \cdot [ek(i-1) - d_t]$.

Thereafter, the noise component yk(i) produced by the synchronous adaptive noise canceling filter means 1 is subtracted from the signal d(t) to be processed to provide the target signal ek(i).

That is to say, the target signal ek(i) can be expressed as:

$$ek(i) = dk(i) - yk(i)$$

If the above-described series of processings is sequentially carried out for the other phases, the noise component y(t) produced by the synchronous adaptive noise canceling filter means 1 is finally converged to the signal d(t) to be processed from which the direct current level of the original signal d(t) to be processed is subtracted.

A specific circuit configuration of the second preferred embodiment is already shown in FIG. 7 of the first preferred embodiment. Therefore, the detailed description of the circuit configuration will be omitted here.

An operation of the periodic noise canceling system in the second preferred embodiment will be described below with reference to an operational flowchart shown in FIG. 13.

Suppose that the entire level of the signal d(t) to be processed through the low-pass filter 23 is stationary and the signal waveform is, e.g., shown in FIG. 9(B). At this time, the waveform of the pulse signal passed through the waveform shaper 24 appears as shown in FIG. 9(A). The main control circuit 25 (CPU 30) receives the pulse signal X(t) as an interrupt signal. Whenever the pulse signal X(t) rises, the series of processings shown in FIG. 13 is carried out.

First, in the step 1, a level value d of the signal d(t) sampled during the interruption of the pulse signal is converted through the analog-to-digital conversion (A/D conversion) and is stored in the common register d.

In this way, when the noise component y is outputted from the main control circuit 25, the noise component y is subtracted from a part of the signal d(t) at that phase so that the target signal e is outputted from the signal processing unit 20.

Furthermore, the main control unit 25 carries out a processing of an average level subtraction operation from the target signal d(t) to be processed. That is to say, the register Wa stores the sum of the signal values d sampled whenever the output shaft of the transmission is rotated through an 1/N rotation (for each phase of 360/N). When the signal level value d is sampled at the rotation position (phase) in the step 1, the signal level value d which has been stored in the RAM 32 at the previous same position (phase) is subtracted from the sum within the register Wa (Wa←Wa−dk). The noise component yk which has been o calculated and stored at the previous same position (phase) is transferred from the RAM 32 to the common register y in the step 2. The noise component y registered in the common register y converted into analog form is outputted in the step 3. In the next step 42, the currently sampled signal level value d is added to the subtracted sum value and the result is stored into a register Wa (Wa←Wa+d).

Figure 10:
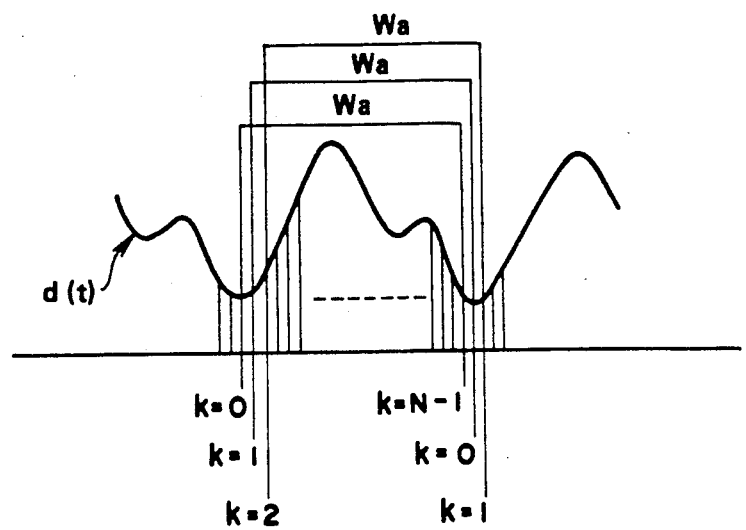
FIG. 10 is a status diagram of a register Wa in the main control circuit 25 shown in FIG. 7.

Consequently, the register Wa always holds a stored state in which the sum of the signal level values d sampled in the past one period (refer to FIG. 10).

In a step 10, the average level $d_m$ is calculated by dividing the sum (Wa) stored in the register Wa by the number of times the sampling is carried out for the one period ($d_m = Wa/N$). In a step 43, the signal level value $d_k$ sampled at the previous same position (phase) is subtracted from the signal level value d currently sampled and the subtracted result $d_d$ ($d_d$−d−$d_k$) is handled as the increase/decrease amount of the direct current level of the signal d(t) to be processed.

Then, in a step 44, the direct current level $d_t$ of the signal d(t) to be processed is determined on the basis of the extracted average level $d_m$ and detected increase/decrease amount $d_d$ in accordance with the following equation: $d_t = d_m + d_d/2$.

Since the original signal d(t) to be processed is the signal waveform as shown in FIG. 9(B) (the level values at the same phase are approximately equal to each other, i.e., the direct current level is approximately constant), the increase/decrease amount $d_d$ derived in the step 43 becomes substantially zero ("0") and the direct current level $d_t$ drived in the step 44 accordingly becomes the average level $d_m$ extracted as described above. Thereafter, the signal level value $d_k$ within the RAM 32 is updated to the signal level value d newly sampled in a step 9 (d→$d_k$).

In a step 91, a difference e between the signal level value d and noise component value y, these values being stored respectively in the registers d and y, is calculated in order to obtain a value corresponding to the output (target signal e) drived from the arithmetic operation circuit 26 (e←d−y). Then, a new noise component is calculated on the basis of the derived value e, the noise component y stored in the common register y, and direct current level $d_t$ determined as described above in accordance with the following equation:

$$y + \alpha \cdot (e - d_t)$$

wherein $0 < \alpha < 1$ and $\alpha$ denotes a correction coefficient. Then, the calculated result is newly stored in the common register y (y←y+α·(e−$d_t$)). Thereafter, the noise component yk within the RAM 32 is updated to the noise component stored in the register y (y→yk) in a step 93.

Thereafter, the main control circuit 25 repeatedly carries out the sampling processing of the signal level value d, extracting processing of the average level $d_m$, detecting processing of the increase/decrease amount, producing processing of the new noise component y and so on whenever the pulse signal X(t) rises. Whenever the above-described series of processings are ended, the register k is incremented in the step 11. In the steps 12 and 13, the register k is reset whenever the contents of the register k reaches N.

Since in the case when the original signal d(t) to be processed has the direct current level of approximately constant value as appreciated from FIG. 9(B), the average value $d_m$ is calculated for the past one period and the new noise component y is calculated on the basis of the value of the target signal e from which the average level value $d_m$ is subtracted (e−$d_t$) ($d_t = d_m$) and the previously calculated noise component y in accordance with the following formula: y+α·(e−$d_t$), the noise component y(t) outputted from the main control circuit 25 gradually approaches the real noise signal component as shown in FIG. 9(E). The output signal of the arithmetic operation circuit 26, i.e., the target signal e(t) is converged to the real signal included in the signal d(t) to be processed (direct current level corresponding to the torque) (refer to FIG. 9(F)).

Figure 14:
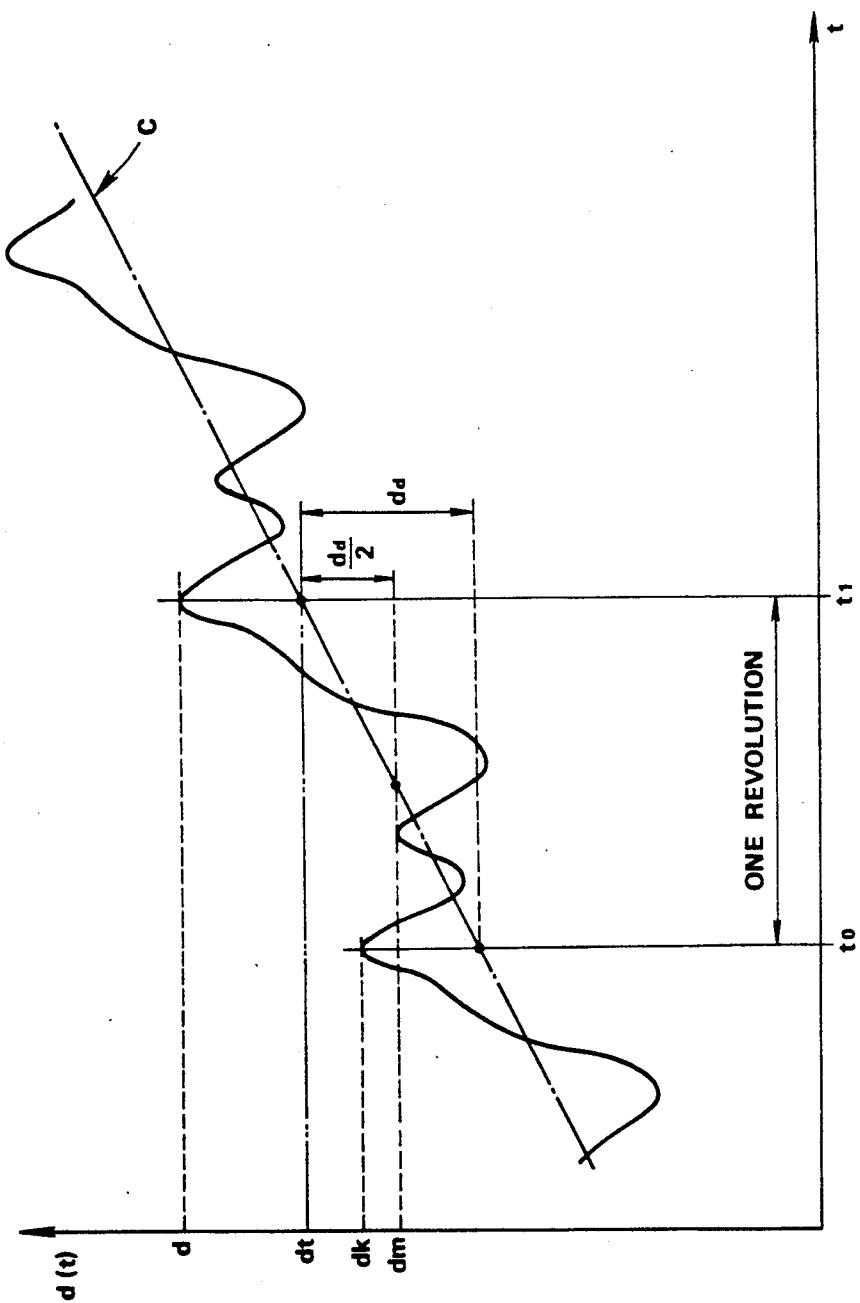
FIG. 14 is a waveform chart of still another example of the original input signal d(t) t be processed.

On the other hand, suppose that the direct current level C of the original signal d(t) to be processed is gradually changed as the torque of the output shaft of the transmission is varied, for example, as shown in FIG. 14.

Figure 13:
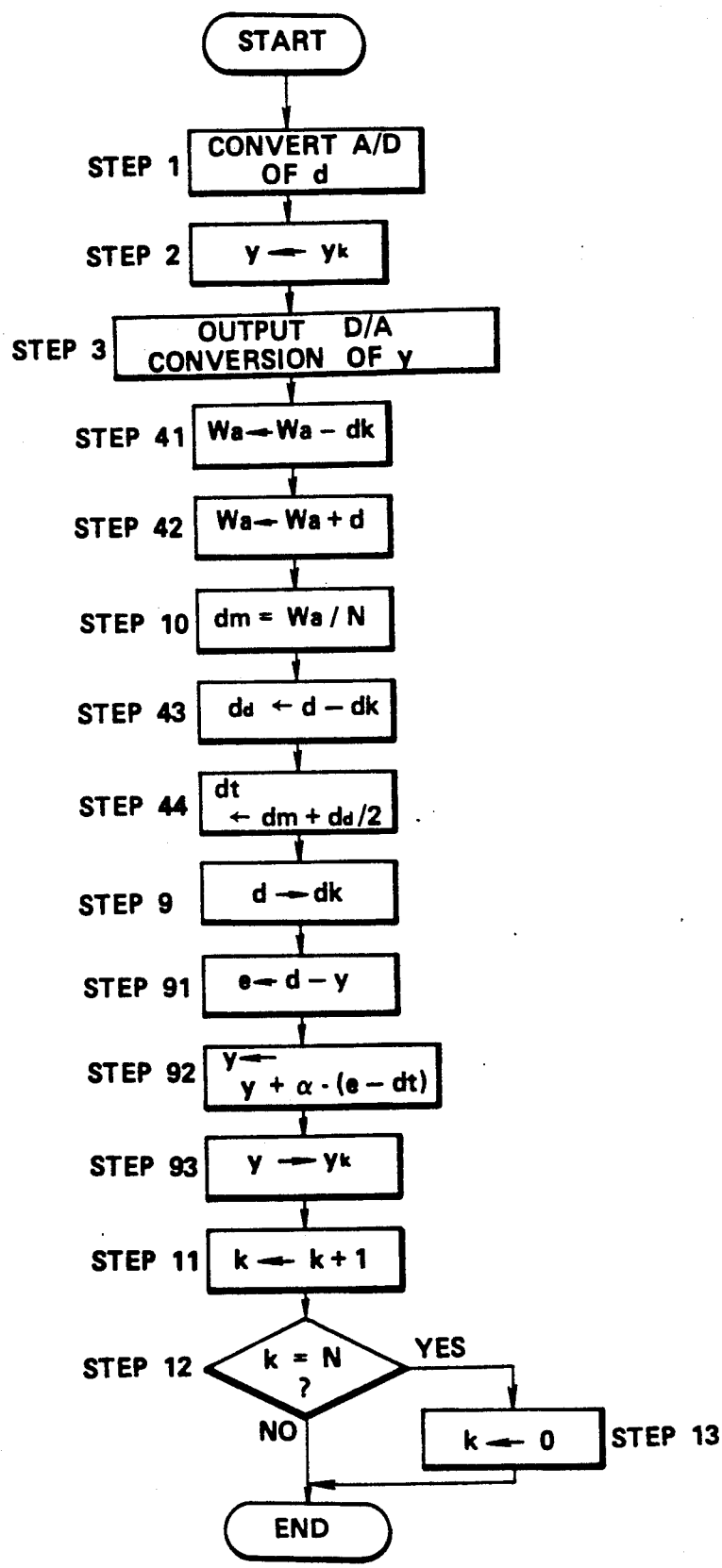
FIG. 13 is an operational flowchart on which the main control circuit 25 in the second preferred embodiment is executed.

The main control circuit 25 carries out the series of processings shown in FIG. 13 in the same way as described above.

For example, at a phase of the original signal d(t) corresponding to a time $t_1$ shown in FIG. 14, the average level value $d_m$ derived in the steps 41, 42, and 10 approaches an average of the signal level value d(t) which has been sampled for one period from a time $t_o$ at which the phase becomes the same as that at the time $t_1$ to the time $t_1$. It should be noted that in the case of the original signal d(t) to be processed shown in FIG. 14 the average level $d_m$ extracted at the time $t_1$ becomes approximately equal to the direct current level C of the signal d(t) at a center point of time between the times $t_o$ and $t_1$. Hence, the actual direct current level C at the time $t_1$ does not coincide with the extracted average level value $d_m$.

Next, although the increase/decrease amount $d_d$ is calculated in the step 43 in FIG. 13 (in other words, the difference between the signal level value d sampled at the time $t_1$ and the signal level value $d_k$ which has been sampled in the previous sampling processing at the time $t_o$), the increase/decrease amount $d_d$ is substantially equal to the difference between each direct current level C of the original signal d(t) to be processed at the times of $t_o$ and $t_1$. In addition, the direct current level $d_t$ ($d_t = d_m + d_d/2$) determined through a straight line approximation method on the basis of the extracted average level $d_m$ and detected increase/decrease amount $d_d$ substantially coincides with the actual direct current level C of the original signal d(t) to be processed at the time $t_1$ as shown in FIG. 14.

Since, as described above, even in a case when the original signal d(t) to be processed has the direct current level C gradually changes as shown in FIG. 14, the direct current level $d_t$ determined in the series of processings shown in FIG. 13 considerably approaches the actual direct current level C. Consequently, the noise component produced in the processing of step 91 is converged to the real noise component included in the signal d(t) to be processed. In this embodiment, the noise component produced during the series of processings by means of the main control circuit 25 is converged to the real noise component and accordingly the target signal e(t) outputted from the signal processing unit 20 is converged to the real signal (the direct current level corresponding to the torque described above) included in the signal d(t) to be processed.

Consequently, the torque imposed on the output shaft of the transmission can be detected on the basis of the output signal derived from the above-described signal processing unit 20 without substantial delay and, for example, an accurate control of the torque converter in the automatic transmission shown in FIG. 3 can be achieved on the basis of the detected magnitude of torque described above.

THIRD PREFERRED EMBODIMENT

Figure 15:
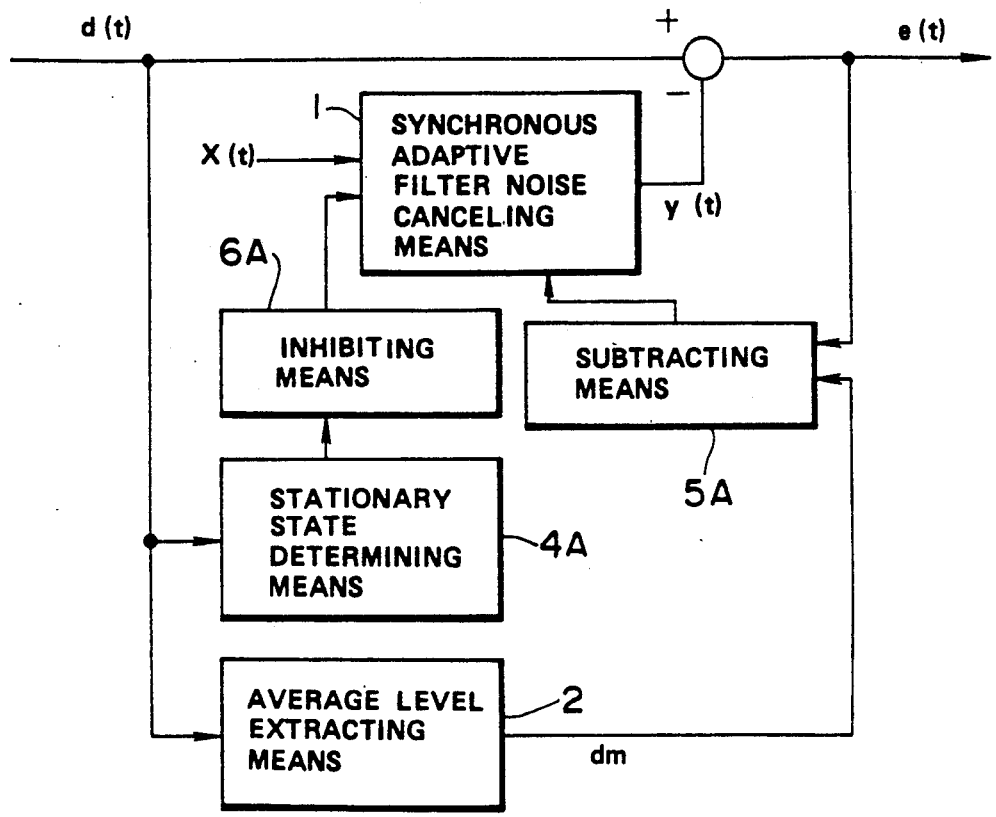
FIG. 15 is a functional block diagram of the periodic noise canceling system in a third preferred embodiment according to the present invention.

FIG. 15 shows a general concept of a third preferred embodiment according to the present invention.

The synchronous adaptive noise canceling filter means 1 has already been described.

The average level extracting means 2 and subtracting means 5A have also been described. In addition, in this embodiment, the periodic noise canceling system includes stationary state determining means 4A for determining whether the whole level of the original signal d(t) to be processed is stationary and inhibiting means 6A for inhibiting the production of a new noise component in the synchronous adaptive noise canceling filter means 1 when the stationary state determining means 4A determines that the whole level of the signal d(t) is not stationary.

In the operation on this embodiment, when the stationary state determining means 4 determines that the whole level of the signal d(t) to be processed is stationary (for example, the signal d(t) to be processed is as shown in FIG. 4 (B)), the periodic noise canceling system carries out the following procedure.

That is to say, the average level extracting means 2 always extracts the average level $d_m$ of the signal d(t) to be processed. At the predetermined phase k described in the previous embodiments, the synchronous adaptive noise canceling filter means 1 receives a signal expressed as $ek(i-1) - d_m$ from the subtracting means 5A and produces the noise component yk(i) in accordance with the equation expressed as $yk(i) = yk(i-1) + \alpha 1 \cdot [ek(i-1) - d_m]$ on the basis of the received signal. In this embodiment, the above-expressed $\alpha 1$ denotes a predetermined correction coefficient.

The noise component yk(i) produced by the synchronous adaptive noise canceling filter means 1 is subtracted from the original signal dk(i) to be processed to produce the target signal ek(i). That is to say, the following equation results: $ek(i) = dk(i) - yk(i)$.

When the above-described processing is sequentially carried out for the other phases, the noise component produced by the synchronous adaptive noise canceling filter means 1 is finally converged to a value of the signal d(t) to be processed from which the average level of the signal d(t) to be processed is subtracted.

Figure 20:
FIG. 20 is a waveform chart of yet another example of the original input signal d(t) to be processed.

On the other hand, if the stationary state determining means determines that the whole level of the signal d(t) to be processed is not stationary (for example, the direct current level of the signal d(t) to be processed is varied as shown in FIG. 20), the difference between the average level $d_m$ extracted by the average level extracting means 2 and actual direct current level of the original signal d(t) to be processed becomes large. This is because the average level $d_m$ depends on the state of the original signal d(t) to be processed before the average level $d_m$ is extracted. Especially, the signal d(t) to be processed shown in FIG. 20 is largely varied before the average level is extracted.

If the difference between the extracted average level $d_m$ and actual direct current level is large, the noise component produced by the synchronous adaptive noise canceling means on the basis of the difference between the target signal level value e and average level $d_m$ ($e - d_m$) becomes deviated from the actual noise component included in the original signal d(t).

Therefore, in this embodiment, the inhibiting means 6A inhibits the production of a new noise component from the synchronous adaptive noise canceling filter means 1 when the stationary state determining means 4A does not determine that the whole level of the signal d(t) to be processed is stationary. While the production of the new noise component is inhibited, the target signal e(t) is derived by subtracting the already produced noise component from the original signal d(t) to be processed.

A specific construction of the periodic noise canceling system in the third preferred embodiment is already shown in FIG. 7 as described in the first and second preferred embodiments. Therefore, the detailed description of the specific circuit configuration in the third preferred embodiment will be omitted here.

The operation of the third preferred embodiment will be described below with reference to FIG. 17.

Figure 17:
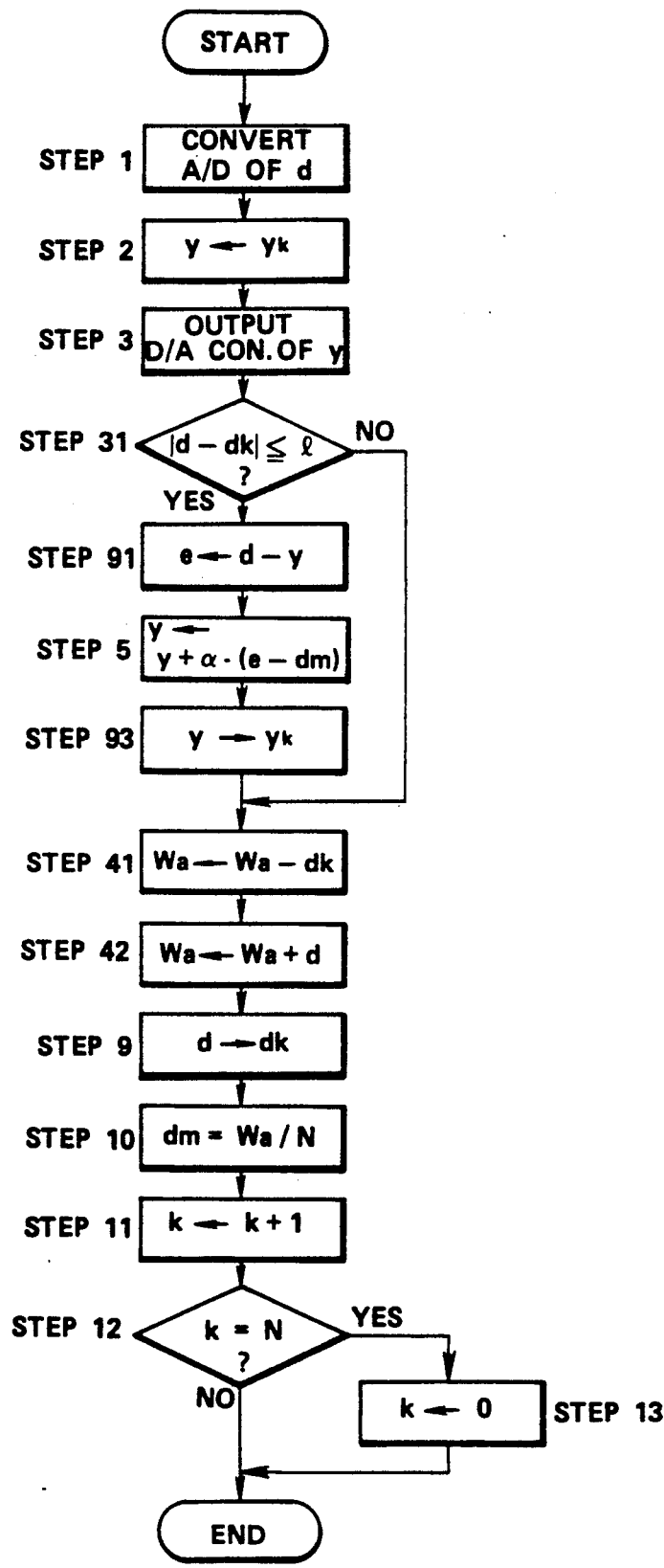
FIG. 17 is an operational flowchart on which the main control circuit in the third preferred embodiment is executed.

FIG. 17 shows an operational flowchart in the third preferred embodiment on which the main control circuit 25 is executed.

Suppose that the whole level of the original signal d(t) to be processed is stationary and the waveform of the signal d(t) to be processed is, for example, shown in FIG. 9(B). At this time, the pulse signal shaped by the waveform shaper 24 is shown in FIG. 9(A).

The main control circuit 25 (CPU 30) receives the pulse signal X(t) as the interrupt signal. Whenever the pulse signal X(t) rises, the series of processings shown in FIG. 17 is sequentially carried out.

The pulse signal XX(t) rises whenever the output shaft of the transmission is rotated through 1/N rotation. Each rotational position (phase) at which the signal rises corresponds to a subscript k in FIG. 17, as described above. In FIG. 17, the contents of the same step numbers 1 through 13 have already been described in the first and second preferred embodiments with reference to FIGS. 8 and 13. Therefore, the detailed description of these steps will be omitted here.

In a step 31, the main control circuit 25 determines whether a difference between the signal level value $d_k$ (stored in the RAM 32) at the previous same position (phase) and that d currently sampled Satisfies the following equation.

$$|d-d_k| \leq \lambda, \quad \lambda: \text{constant number}$$

In this case, since the whole level of the signal d(t) to be processed is stationary as appreciated from FIG. 9(B), the signal level value $d_k$ at the previous same position (phase) and the signal level value d which has been sampled at the current processing are approximately equal to each other. Therefore, the above-described condition ($|d-d_k| \leq \lambda$) is satisfied. If yes in the step 31, the main control circuit 25 derives (e=d−y). The following processing is the same as described in the first preferred embodiment with reference to FIG. 8. On the other hand, suppose that during the above-described series of processings the torque imposed on the output shaft of the transmission is largely varied due to the switching of the rotation ratio of the transmission or etc. and the whole level of the signal to be processed derived from the magnetostrictive torque sensor 16 and passed through the low pass filter 23 is not stationary (the waveform of the above-described signal to be processed is shown in FIG. 18(A)).

In this case, the direct current level of the signal d(t) to be processed is changed and the difference between the signal level value d which has currently been sampled and that $d_k$ which has previously been sampled at the same rotational position (phase) and stored in the RAM 32 gives the following inequality:

$$|d-d_k| > \lambda.$$

At this time, the routine goes from the step 31 to step 7. That is to say, the new production of the noise component and updating of the noise component yk in the RAM 32 are inhibited.

While the above-described relationship between the signal level value d which has currently been sampled and that $d_k$ which has previously been sampled is held (an interval between the times $t_1$ and $t_2$ in FIG. 18), the processings from the step 4 to the step 6 are continued to be inhibited. The noise component y(t) outputted from the main control circuit 25 during this process becomes the noise component stored in the RAM 32 without update operation.

Figure 18:
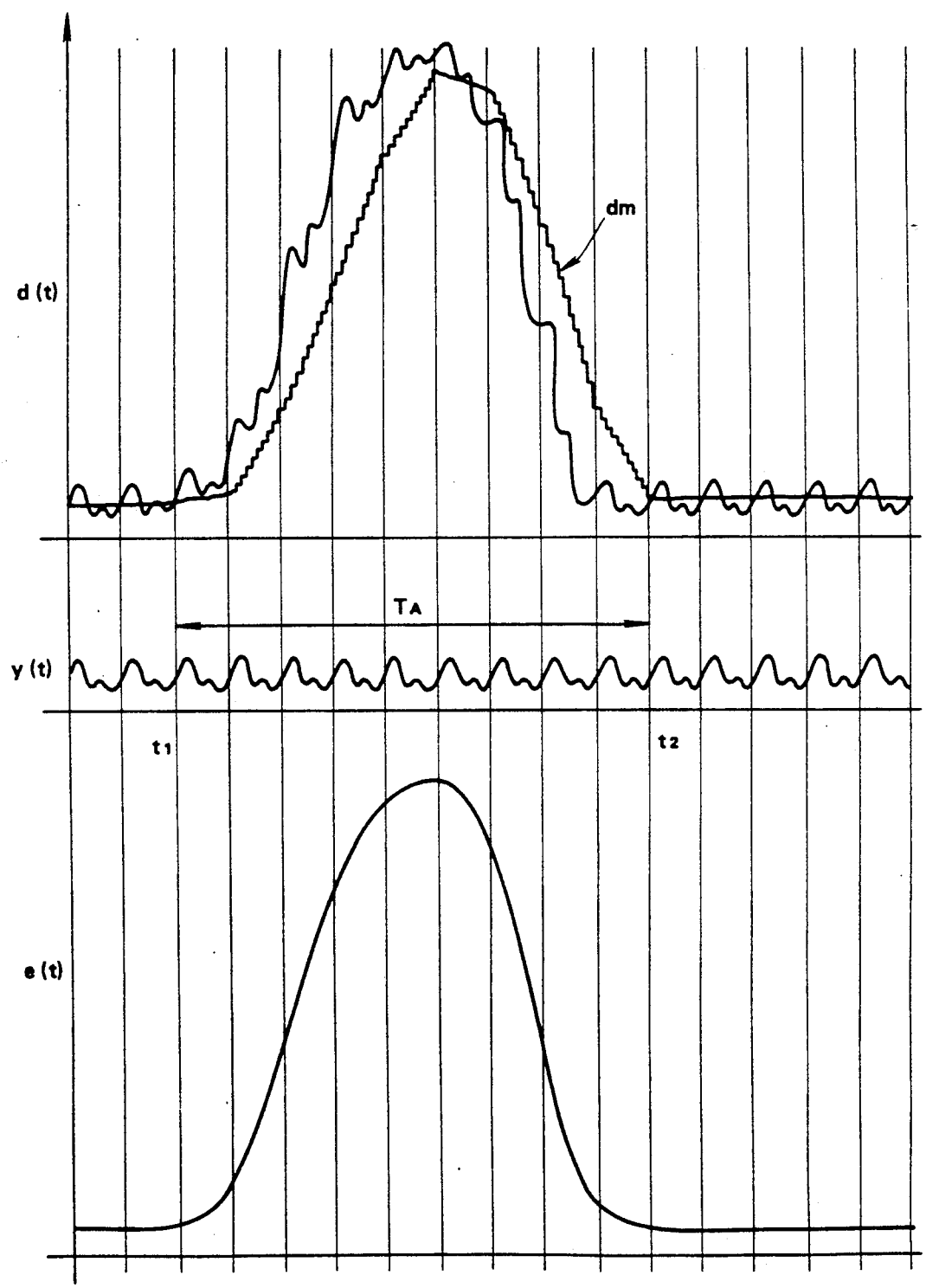
FIG. 18 is a waveform chart of original input, output, and target signals in adaptive noise canceling filter means 1 shown in FIG. 15 in the third preferred embodiment.

If the noise component which has been produced before the time $t_1$ in FIG. 18 (noise component which has already been stored) is sufficiently converged to the real noise component after the waveform processings shown in FIGS. 9(A) through 9(F), the target signal derived from the arithmetic operation circuit 26 (output signal of the signal processing unit 20) follows the torque variation as shown in e(t) of FIG. 18(B).

It is noted that the average level $d_m$ derived from the processings in the steps 7 through 10 becomes deviated from the direct current level at a point where the direct current level of the signal to be processed is largely varied, e.g., as shown in $d_m$ in FIG. 18(A).

As described above, the periodic noise canceling system in the third preferred embodiment produces the target signal from the signal to be processed derived from the low pass filter 23 in which the noise components are eliminated. Hence, the torque imposed on the output shaft of the transmission can be detected without substantial delay on the basis of the target signal.

FOURTH PREFERRED EMBODIMENT

Figure 16:
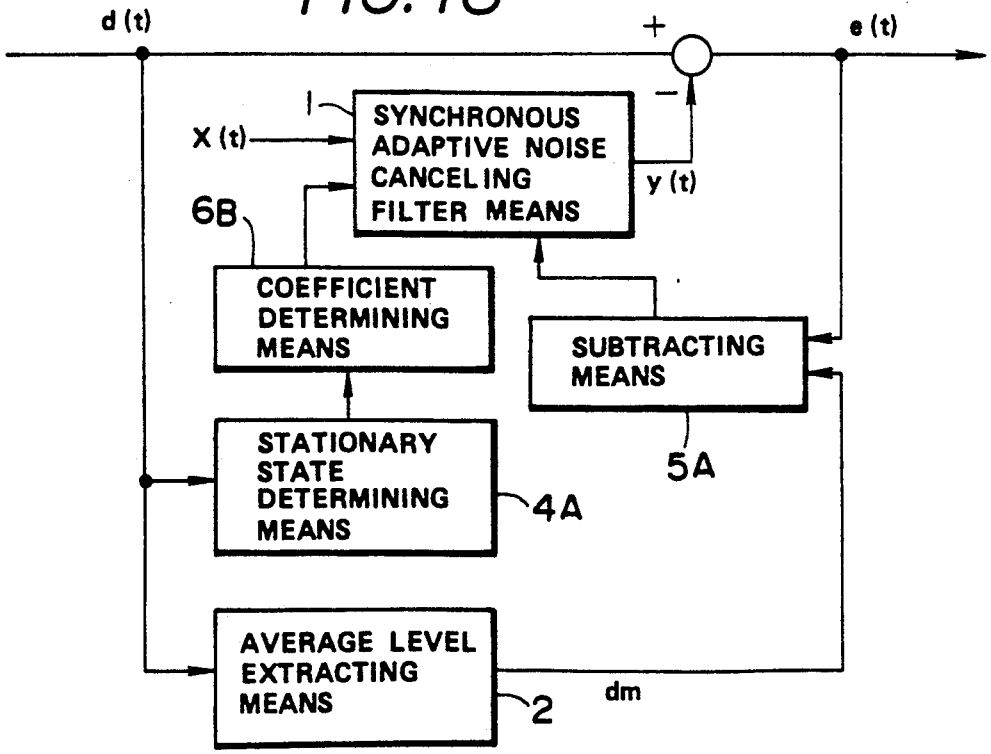
FIG. 16 is a functional block diagram of the periodic noise canceling system in a fourth preferred embodiment according to the present invention.

FIG. 16 shows a general concept of the periodic noise canceling system in a fourth preferred embodiment according to the present invention. The synchronous adaptive noise canceling filter means 1, average level extracting means 2, subtracting means 5A, and stationary state determining means 4A are the same as those described in the third preferred embodiment with reference to FIG. 15.

In this embodiment, however, correction coefficient determining means 6B is provided in place of the inhibiting means 6A shown in FIG. 15 for determining the correction coefficient used in the synchronous adaptive noise canceling filter means 1 on the basis of the determination result in the above-described stationary state determining means 4A. The general operation of the fourth preferred embodiment is substantially the same as that of the third preferred embodiment. Therefore, the detailed description thereof will be omitted here.

However, the difference between the general operations of the third and fourth preferred embodiments will be described below.

In the third preferred embodiment, when the stationary state determining means 4A determines that the whole level of the signal d(t) to be processed is not stationary, the inhibiting means 6A inhibits the production of the new noise component in the synchronous adaptive noise canceling filter means 1. While the production of the new noise component is inhibited, the target signal e(t) is produced by subtracting the noise component which has already been produced from the signal d(t) to be processed.

On the other hand, in the fourth preferred embodiment, when the stationary state determining means 4A determines that the whole level of the signal d(t) to be processed is not stationary, the correction coefficient determining means 6 changes from $\alpha 1$ described above to, e.g., another value $\alpha 2$. The correction coefficient $\alpha 2$ is smaller than that $\alpha 1$ ($\alpha 2 < \alpha 1$) so that an influence of the formula $\alpha 2$. [ek(i)−$d_m$] on the noise component yk(i) produced by the synchronous adaptive noise canceling filter means 1 becomes smaller when the noise component is produced.

The specific circuit construction in this embodiment is the same as that shown in FIG. 7.

Figure 19:
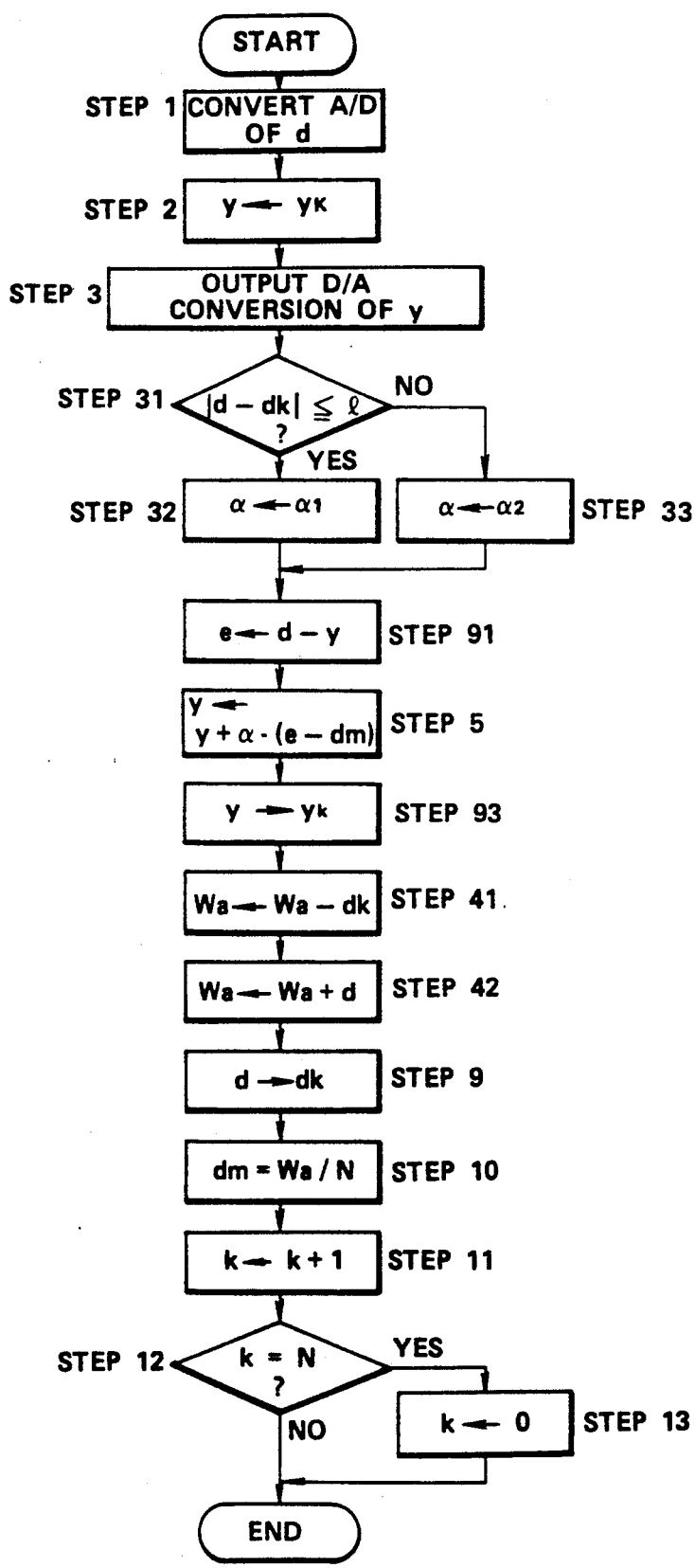
FIG. 19 is an operational flowchart in the fourth preferred embodiment on which the main control circuit is executed.

FIG. 19 shows an operational flowchart representing a processing flow of the main control circuit 25 in the fourth preferred embodiment.

The series of processings shown in FIG. 19, i.e., the sampling processing of the signal level value d in the step 1, output processing of the noise component y in the steps 2 and 3, producing processing of the new noise component y in the steps 91, 5 and 93, extraction processing of the average level $d_m$ in the steps 41, 42, 9, and 10, and phase matching processing in the steps 11, 12, and 13 are carried out whenever the reference pulse signal X(t) rises in the same way as shown in FIG. 17.

In FIG. 19, the difference between the signal level value d which has been sampled and signal level value $d_k$ which has previously been sampled at the same rotational position (phase) satisfies the following relationship in the step 31; $|d-d_k| \leq \lambda$, the routine goes to the step 32. In the step 32, the correction coefficient $\alpha$ is set to $\alpha 1$ which is used to produce the new noise component in the step 5 ($y \leftarrow -y + \alpha \cdot (e-d_m)$). It is noted that the set correction coefficient $\alpha 1$ is the same as $\alpha$ used in one of the processings (step 5) of FIG. 17 and is appropriately selected to a value falling in a range between zero and one ($0<\alpha<1$) with stability and responsiveness during the process in which the noise component is produced by the synchronous adaptive noise canceling filter means 1 taken into account.

On the other hand, in a case when the difference between the signal level value d which has been sampled during the series of processings and that $d_k$ which has previously been sampled at the same rotational position (phase) satisfies the following inequality; $|d-d_k|>1$, the routine goes to the step 33 since the whole level of the signal d(t) is not stationary, e.g., as shown in FIG. 18. In the step 33, the correction coefficient $\alpha$ is set to $\alpha 2$ which is smaller than $\alpha 1$ ($\alpha 1 > \alpha 2$). Consequently, the direct current level of the signal d(t) to be processed is largely changed and is deviated from the extracted average level $d_m$ as shown in FIG. 18. However, since in this case the difference between the target signal value e and average level $d_m$ ($e-d_m$) hardly contributes to the production of the noise component, the produced noise component will not be deviated from the actual noise component.

It should be noted that in the correction coefficient processing shown in FIG. 19 (steps 31, 32, and 33), the correction coefficient $\alpha$ may be determined more precisely within the range expressed as $0<\alpha<1$ on the basis of the difference between the sampled value of the signal to be processed and that which has previously been sampled.

EFFECT

As described hereinabove, in the periodic noise canceling system and method according to the present invention, the noise components sequentially produced by the synchronous adaptive noise canceling filter means are converged to the real noise component without elimination of the real direct-current level component even if the periodic noise are superposed on the predetermined direct-current level component of the original signal to be processed.

In addition, even if the direct current level of the original signal to be processed is largely changed, the noise component in each phase to be subtracted from the original signal to be processed will not largely be changed from the value which has previously been produced. Consequently, the periodic noise canceling system can produce a signal approximate to the more real signal component from which the periodic noise is eliminated.

It will clearly be understood by those skilled in the art that the foregoing description has been made in terms of the preferred embodiments and various changes and modifications can be made without departing from the scope of the present invention which is to be defined by the appended claims.

What is claimed is:

1. A system for canceling a real periodic noise superposed on a real signal component of an original signal having the periodic noise in synchronization with a reference signal having a correlationship to a period of the original signal, comprising:
    a) first means for sequentially producing a noise component at each predetermined phase of the original signal;
    b) second means for subtracting the periodic noise produced and supplied from said first means from the original signal so as to produce an error signal; and
    c) third means comprising an average input level extracting means, and a subtracting means to subtract said extracted average input level from the error signal produced by said second means, for producing and supplying a signal to said first means in response to the error signal derived from the second means and original signal, the signal supplied by the third means to the first means being such that when said signal is received from the third means by the first means, the first means produces only a real periodic noise without a said real signal component and the signal component derived from the second means indicates a DC level real signal component based on the real signal component derived previously from said second means and the original signal.

2. The periodic noise canceling system according to claim 1, wherein said third means comprises:
    a fourth means, for subtracting the average level of the original signal derived by said third means from the target signal derived by said second means and producing and supplying the signal representing the subtracted result to said first signal as the signal derived by the third means so that the noise component derived from said first means is converged to the original signal from which the average level of the original signal is subtracted.

3. The periodic noise canceling system according to claim 1, wherein said third means comprises:
    a) fourth means for detecting a change rate of direct current (DC) level of the original signal;
    b) fifth means for determining the direct current level of the original signal on the basis of the average level of the original signal detected by the third means; and
    c) sixth means for subtracting the direct current level of the original signal determined by said fifth means from the target signal derived by said second means and producing and supplying the signal representing the subtracted result to said first means so that the noise produced by said first means is finally converged to the original signal from which the direct current level of the original signal is subtracted.

4. The periodic noise canceling system according to claim 2, wherein said third means further comprises:
    a) fifth means for determining whether an entire level of the original signal is stationary; and
    sixth means for inhibiting the production of a new periodic noise which is to be produced by the first means at a next one to the current predetermined phase while said fifth means determines that the entire level of the original signal is not stationary.

5. The periodic noise canceling system according to claim 4, wherein said second means subtracts the noise already produced by said first means at the current predetermined phase from the original signal while said sixth means inhibits the production of the new periodic noise from said first means.

6. The periodic noise canceling system according to claim 4, wherein said first means produces the noise yk(i) at the current predetermined phase (k) in accordance with such an equation as $yk(i) = yk(i-1) + \alpha 1 \cdot [ek(i-1) - d_m]$, wherein (i−1) denotes a phase prior to the present predetermined phase, ek(i−1) denotes the signal derived previously by said second means, $d_m$ denotes the average level of the original signal derived by said third means, and α1 denotes a correction coefficient for the subtraction result of said fourth means and falls within a range between zero and one.

7. The periodic noise canceling system according to claim 2, wherein said third means further comprises:
   a) fifth means for determining whether an entire level of the original signal is stationary or does not change with times;
   b) sixth means for determining a correction coefficient according to a determination result of the fifth means, the correction coefficient being used to correct the subtraction result of said fourth means when said fourth means produces and supplies the signal representing the subtraction result of the average level of the original signal and the signal to said first means.

8. The periodic noise canceling system according to claim 7, wherein said sixth means changes the correction coefficient to another correction coefficient when said fifth means determines that the entire level of the original signal is not stationary.

9. The periodic noise canceling system according to claim 8, wherein the other correction coefficient is smaller than the correction coefficient.

10. A system for detecting a torque imposed on an output shaft of an automatic transmission with a period noise canceling system comprising:
   a) a magnetostrictive sensor for detecting a change in a magnetic field of the output shaft which is alternatively magnetized with the change in the torque imposed on the output shaft and outputting a first signal indicating the detected change in the magnetic field;
   b) first means for detecting a rotation of the output shaft and outputting a second signal in synchronization with the rotation of the output shaft;
   c) second means for sequentially producing a noise component at each predetermined phase of the first signal derived from said magnetostrictive sensor in synchronization with the second signal derived from said first means;
   d) third means for subtracting the noise signal component produced by said second means from the first signal so as to produce a real signal component of the first signal; and
   e) fourth means comprising an average input level extracting means and a subtracting means to subtract said extracted average input level from the error signal produced by said third means, for producing and supplying a third signal to said second means so that said second means produces a real noise signal component with the signal component derived previously from said third means and the first signal derived from the magnetostrictive sensor.

11. The torque detecting system according to claim 10, wherein said fourth means comprises:
   a fifth means for subtracting the average level ($d_m$) from said signal $ek(i-1)$ derived previously from said third means so that said second means produces the noise signal component in accordance with the equation $yk(i)=yk(i-1)+\alpha 1 \cdot [ek(i-1-d_m]$, wherein α1 denotes a correction coefficient and falls in a range between zero and one and $yk(i-1)$ denotes the noise signal component derived one predetermined phase before.

12. The torque detecting system according to claim 11, wherein said third means produces the target signal expressed as $ek(i)=dk(i)-yk(i)$, wherein $dk(i)$ denotes the first signal derived at the current predetermined phase.

13. The torque detecting system according to claim 10, wherein said fourth means comprises:
   a) fifth means for detecting a change rate of a direct current a level of the first signal;
   b) sixth means for determining the direct current level ($d_t$) of the first signal on the basis of the average level of the first signal extracted by said fourth means and change rate of the direct current level of the first signal;
   c) seventh means for subtracting the direct current level of the first signal determined by said sixth means from the signal ($ek(i-1)$) derived by said third means and producing and sending the third signal representing the subtracted result ($ek(i-1)-d_t$) to said second means so that the noise component produced by said second means is converged to the first signal from which the direct current level of the first signal is subtracted.

14. The torque detecting system according to claim 11, wherein said fourth means further comprises:
   a) sixth means for determining whether an entire level of the first signal is stationary on the basis of the sampled first signal; and
   b) seventh means for inhibiting the production of a new noise signal component from said second means when said sixth means determines that the entire level of the first signal is not stationary.

15. The torque detecting system according to claim 14, wherein said sixth means determines whether the entire level of the first signal is stationary depending on whether the following inequality is established: $|d-d_k| \leq \lambda$, wherein λ denotes a constant number, d denotes a level of the first signal previously sampled at the same predetermined phase and $k_k$ denotes the level of the first signal currently sampled at the same predetermined phase.

16. The torque detecting system according to claim 11, wherein said fourth means further comprises:
   a) sixth means for sampling the first signal and determining whether an entire level of the first signal is stationary on the basis of the sampled first signal;
   b) seventh means for determining a correction coefficient (α1, α2) according to a determination result of said sixth means, the correction coefficient being used to correct the subtraction result of said fifth means when said fifth means produces and sends the signal representing the subtraction result ($[ek(i-1)-d_m]$) to said second means.

17. The torque detecting system according to claim 16, wherein said seventh means changes the correction coefficient to another correction coefficient (α2) when said sixth means determines that the entire level of the first signal is not stationary, so that said second means produces the new noise signal component expressed as follows: $yk(i)=yk(i-1)+\alpha 2 \times [ek(i-1)-d_m]$, wherein α2 denotes the other correction coefficient (α1) which is determined when said sixth means determined that the entire level of the first signal is stationary.

18. A system for canceling a periodic noise superposed on a real signal component of an original signal, comprising:
   a) first means for sequentially producing a noise component at each predetermined phase of the original signal having the periodic and real signal component in synchronization with a signal having a correlationship to a period of the original signal;

b) second means for subtracting the periodic noise produced and supplied from the first means from the original signal so as to produce the real signal component as an error signal; and c) third means comprising an average input level extracting means, and a subtracting means to subtract said extracted average input level from the error signal produced by said second means, for producing and supplying a signal to said first means in response to the real signal component derived from the second means and original signal, the signal supplied by the third means to the first means being such that when the signal is received from this means by the first means, the first means produces only a real periodic noise without the real signal component and the real signal component derived from the second means indicates a DC level real signal component and being based on the real signal component derived previously from said second means and the original signal.

19. The method according to claim 18, wherein said step c) comprises the steps of:

d) sampling the original signal and extracting an average level of the original signal on the basis of the sampled original signal; and e) subtracting the average level of the original signal extracted in the step d) from the target signal derived in said step b) and producing and sending the signal representing the subtracted result in said step d) so that the noise component derived in said step a) is converged to the original signal from which the average level of the original signal is subtracted.

20. The method according to claim 18, wherein said step c) comprises the steps of:

d) sampling the original signal and extracting an average level of the original signal;

e) detecting a change rate of a direct current level of the original signal;

f) determining the direct current level of the original signal on the basis of the average level of the original signal extracted in said step d) and change rate of the direct current level of the original signal detected in said step e);

g) subtracting the direct current level of the original signal determined in said step f) from the target signal derived in said step b) and producing and sending the signal representing the subtracted result to said first means so that the noise component produced by said first means is converged to the original signal from which the direct current level of the original signal is subtracted.

21. The method according to claim 19, wherein said step c) further comprises the steps of:

f) determining whether an entire level of the original signal is stationary; and g) inhibiting the production of a new noise signal component from said first means determining when the entire level is not stationary in said step f).

22. The method according to claim 19, wherein said step c) further comprises the steps of:

f) determining whether an entire level of the original signal is stationary; and g) determining a correction coefficient according to the determination result of said step f); the correction coefficient being used to correct the subtraction result in said step e) when determining in said step f) that the entire level is not stationary.

* * * * *